US011744003B2

(12) United States Patent
Porte et al.

(10) Patent No.: US 11,744,003 B2
(45) Date of Patent: Aug. 29, 2023

(54) DEVICE AND METHOD FOR INTERACTION BETWEEN AN AGILE LASER BEAM AND A HYPERFINE ENERGY TRANSITION OF A CHEMICAL SPECIES

(71) Applicants: IXBLUE, Saint-Germain-en-Laye (FR); INSTITUT D'OPTIQUE GRADUATE SCHOOL, Palaiseau (FR); CENTRE NATIONAL DE LA RECHERCHE SCIENTIFIQUE, Paris (FR); UNIVERSITE DE BORDEAUX, Bordeaux (FR)

(72) Inventors: Henri Porte, Serres les Sapins (FR); Baptiste Battelier, Gradignan (FR)

(73) Assignees: EXAIL, Saint-Germain-en-Laye (FR); INSTITUT D'OPTIQUE GRADUATE SCHOOL, Palaiseau (FR); CENTRE NATIONAL DE LA RECHERCHE SCIENTIFIQUE, Paris (FR); UNIVERSITE DE BORDEAUX, Bordeaux (FR)

( * ) Notice: Subject to any disclaimer, the term of this patent is extended or adjusted under 35 U.S.C. 154(b) by 537 days.

(21) Appl. No.: 16/766,385

(22) PCT Filed: Nov. 22, 2018

(86) PCT No.: PCT/FR2018/052959
§ 371 (c)(1),
(2) Date: May 22, 2020

(87) PCT Pub. No.: WO2019/102157
PCT Pub. Date: May 31, 2019

(65) Prior Publication Data

US 2021/0368612 A1 Nov. 25, 2021

(30) Foreign Application Priority Data

Nov. 24, 2017 (FR) ...................................... 1761161

(51) Int. Cl.
*H01S 5/00* (2006.01)
*H05H 3/04* (2006.01)
(Continued)

(52) U.S. Cl.
CPC ............... *H05H 3/04* (2013.01); *G02F 1/011* (2013.01); *G02F 1/31* (2013.01); *G02F 1/3551* (2013.01);
(Continued)

(58) Field of Classification Search
CPC ... H05H 3/04; G02F 1/011; G02F 1/31; G02F 1/3551; G02F 1/3558; G02F 1/37;
(Continued)

(56) References Cited

U.S. PATENT DOCUMENTS

2009/0296760 A1* 12/2009 Zhu .......................... G04F 5/14 372/32
2014/0060178 A1* 3/2014 Wong .................... G01V 7/005 73/382 G (Continued)

OTHER PUBLICATIONS

B. Battelier et al., "Development of compact cold-atom sensors for inertial navigation," Proc. SPIE 9900, Quantum Optics, 990004 (Apr. 29, 2016) (Year: 2016).*

(Continued)

*Primary Examiner* — Xinning(Tom) Niu
(74) *Attorney, Agent, or Firm* — Nixon & Vanderhye

(57) ABSTRACT

Disclosed is a device for interaction between a laser beam and a hyperfine energy transition of a chemical species. The device further includes an electro-optic modulator with a single sideband with an input optical waveguide suitable for receiving a source laser beam and an output optical waveguide suitable for generating an output laser beam and an electronic system suitable for generating and applying, simultaneously, a first modulated electrical signal, $\sin(\Omega_1 t)$)

(Continued)

Figure 3:
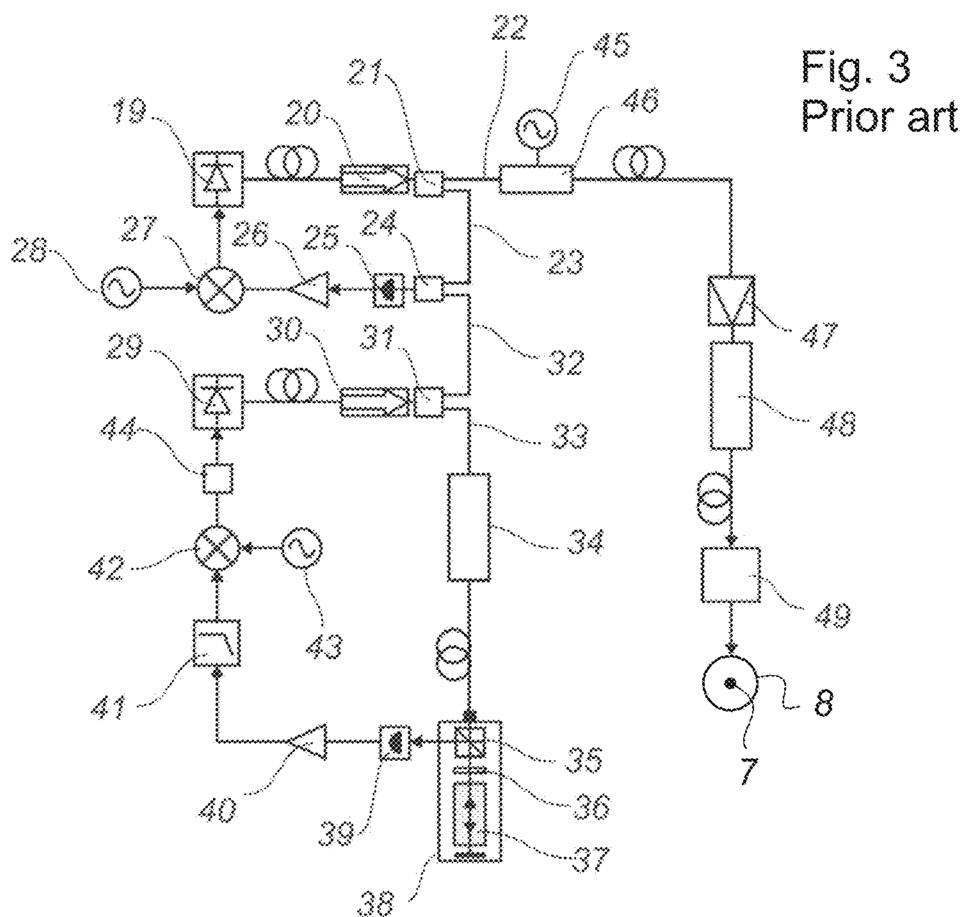

to a first hyperfrequency pulse on a first high-frequency electrode of the electro-optic modulator and, respectively, another modulated electrical signal, $\cos(\Omega_1 t)$) to the first pulse on another high-frequency electrode of the electro-optic modulator, in such a way as to frequency-switch the output laser beam to a first optical frequency offset from the first pulse with respect to the initial optical frequency.

18 Claims, 5 Drawing Sheets

(51) Int. Cl.

| | |
|---|---|
| ***G02F 1/01*** | (2006.01) |
| ***G02F 1/31*** | (2006.01) |
| ***G02F 1/355*** | (2006.01) |
| ***G02F 1/37*** | (2006.01) |
| ***H01S 3/00*** | (2006.01) |
| ***H01S 3/067*** | (2006.01) |
| ***H01S 3/13*** | (2006.01) |
| ***H01S 5/042*** | (2006.01) |
| ***H01S 5/0687*** | (2006.01) |
| ***H01S 5/125*** | (2006.01) |
| ***H01S 5/50*** | (2006.01) |

(52) U.S. Cl.

CPC .............. *G02F 1/3558* (2013.01); *G02F 1/37* (2013.01); *H01S 3/0064* (2013.01); *H01S 3/0085* (2013.01); *H01S 3/0092* (2013.01); *H01S 3/067* (2013.01); *H01S 3/06754* (2013.01); *H01S 3/1305* (2013.01); *H01S 5/0064* (2013.01); *H01S 5/0085* (2013.01); *H01S 5/0092* (2013.01); *H01S 5/0428* (2013.01); *H01S 5/0687* (2013.01); *H01S 5/125* (2013.01); *H01S 5/50* (2013.01); *G02F 2202/20* (2013.01); *G02F 2203/50* (2013.01)

(58) Field of Classification Search

CPC ............. G02F 2202/20; G02F 2203/50; H01S 3/0064; H01S 3/0085; H01S 3/0092; H01S 3/067; H01S 3/06754; H01S 3/1305; H01S 5/0064; H01S 5/0085; H01S 5/0092; H01S 5/0428; H01S 5/0687; H01S 5/125; H01S 5/50; G01P 15/093; G04F 5/14; G01C 19/62

See application file for complete search history.

(56) References Cited

U.S. PATENT DOCUMENTS

| | | | | |
|---|---|---|---|---|
| 2017/0264070 | A1* | 9/2017 | Cingoz ................. | H01S 3/0941 |
| 2018/0356441 | A1* | 12/2018 | Dupont-Nivet ......... | H01S 5/026 |

OTHER PUBLICATIONS

International Search Report, PCT/FR2018/052959, dated Feb. 21, 2019.

Ménoret et al., :“Dual-wavelength laser source for onboard atom interferometry”, Oct. 15, 2011, vol. 36, No. 20/Optics Letters’ pp. 1-4.

Battelier, B. et al., “Development of compact cold-atom sensors for inertial navigation,” Arxiv.org, Cornell University Library, 201,Olin Library Cornell University Ithaca, NY, 14853, May 9, 2016 (May 9, 2016), XP080700186, DOI: 10.1117/12.2228351.

* cited by examiner

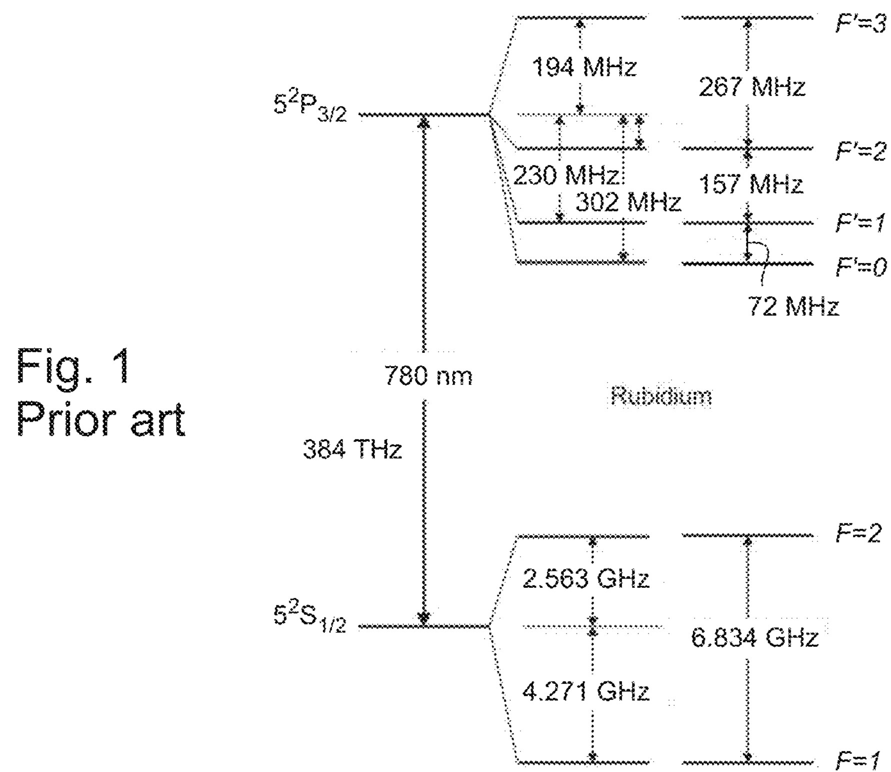
Fig. 1
Prior art
Fig. 2
Prior art
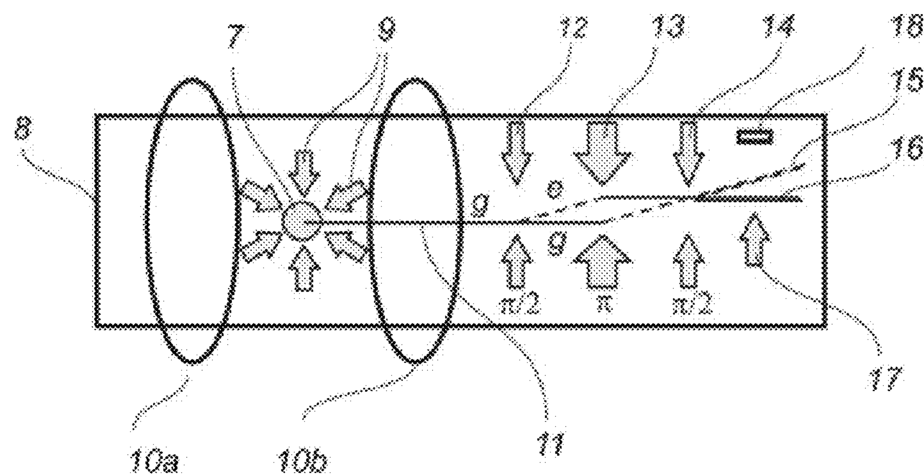

DEVICE AND METHOD FOR INTERACTION BETWEEN AN AGILE LASER BEAM AND A HYPERFINE ENERGY TRANSITION OF A CHEMICAL SPECIES

TECHNICAL FIELD TO WHICH THE INVENTION RELATES

The present invention generally relates to the field of systems for the manipulation of chemical species such as atoms, ions or molecules by laser beams.

In particular, the present invention finds applications in the cold-atom and laser-pulse interferometric systems.

TECHNOLOGICAL BACK-GROUND

The so-called cold-atom technology is based on the control of temperature and the manipulation of clouds of atoms in an ultra-vacuum space. The cold-atom technology allows the making of coherent-atom interferometers. These cold-atom interferometers find applications, in particular, in the atomic clocks for the ultra-high precision metrology of time, in a gravimeter and/or accelerator for acceleration measurements and/or in a gyrometer for rotation measurements. The onboard acceleration or rotation sensors form inertial sensors with respect to the reference system to which they are fastened.

The making of a cold-atom and light-pulse interferometer is based on the interactions between one or several laser sources and atoms in an ultra-vacuum space. The laser source is generally configured to fulfill successively at least five different functions corresponding to the following steps.

The first step consists in slowing down atoms by photon absorption mechanisms in a magneto-optic trap. The second step aims at forming an optical molasse in which the atoms are at a lower temperature making it possible to exploit their atom wave behaviour. The third step is the making of a cold-atom and light-pulse interferometer, wherein at least three laser beams, separated in time or in space, perform the function of splitting blades and mirrors for the atom waves. The fourth step consists in detecting the interference state of the atom waves at the output of the interferometer by laser fluorescence on an atom absorption line. The fifth step is the operation of counting the total number of atoms to normalize the interferometric measurements.

These steps form a sequence whose total duration is generally lower than one second.

All these steps are performed by manipulations of the atoms in their different energy levels based on interactions between laser pulse beams and the atoms. For that purpose, different laser source systems exist, which make it possible to successively and very accurately tune the optical frequency as a function of the different energy transitions used about a transition wavelength characteristic of the atomic species considered.

Such a laser source system must be adapted to generate a single laser line or two simultaneous laser lines, the optical frequency of each of these laser lines switching up to five times during a sequence in a spectral range of less than 100 GHz about the optical transition frequency. Each switching occurs for a duration comprised between a few hundreds of microseconds and a few hundreds of milliseconds. Such a rapidly and very accurately optical-frequency tunable and switchable laser system is also called agile laser source in the present document.

In the present document, it is meant by agile laser, an optical-frequency switchable and tunable laser provided with a very fine setting or tuning of at least one optical frequency located in the THz domain to produce a shift of the laser beam optical frequency, this shift having a maximum amplitude of a few tenth of GHz, or in other words, a very fine wavelength tuning of at most about ten picometres with respect to a predetermined wavelength, for example 800 nm.

Each optical frequency switching corresponds to a very accurately determined wavelength value change as a function of the spectrum of absorption of the atomic species used. Alkali atoms such as caesium (Cs), rubidium (Rb) and/or potassium (K) atoms are generally used. On the other hand, the light power generated on each line must be very accurately controlled. Moreover, in atomic interferometry, the relative phase between the two optical frequencies must be perfectly controlled. Finally, the source laser spectral width must keep its very high fineness during the whole duration of the process.

According to the state of the art, it is known to use a unique stable laser source and to apply a sequence of external electro-optic modulations by means of signals to microwave carrier frequencies of predetermined frequencies. For example, the target wavelength is of 852.34 nm for caesium, 780.24 nm for rubidium and 767 nm for potassium.

FIG. 1 schematically shows the energy levels involved in the rubidium atom cooling process. In the case of rubidium, the 780.24 nm transition corresponds to the transition between the fundamental level $5^2S_{1/2}$ and the higher level $5^2P_{3/2}$. The fundamental level $5^2S_{1/2}$ is actually consisted of two so-called hyperfine sub-levels numbered F=1 and F=2, spaced apart by a far lower transition energy located in the microwave domain, which is of 6.834 GHz for rubidium. The lowest sub-level is called g (for ground) and the highest sub-level corresponding to this microwave transition is called e (for excited). The level $5^2P_{3/2}$ is consisted of four hyperfine levels numbered F'=0, F'=1, F'=2 and F'=3, respectively. For rubidium 87, the spacing between F'=0 and F'=1 is 72 MHz, the spacing between F'=1 and F'=2 is 157 MHz, and, respectively, the spacing between F'=2 and F'=3 is 267 MHz. During a laser-atom interaction experiment, a laser beam slightly detuned with respect to these transitions is generally applied so as to obtain a particular physical effect such as Doppler effect, Zeeman effect, a light shift of the energy levels or a limitation of the spontaneous emission.

Different transition processes implementing at least two photons are currently used in the cold-atom interferometer systems. Certain transition processes are based on Raman transitions, Bragg transitions or also Block oscillations. By way of example, a Raman transition-based configuration is considered herein.

FIG. 2 schematically shows a cooled or slowed-down atom interferometry system. An ultra-vacuum chamber 8 contains a starting cloud of atoms 7. Six laser beams 9 and two magnetic coils 10*a*, 10*b* form a magneto-optic trap (MOT) to cool the atoms during the first step. The six laser beams 9 are arranged so as to be mutually orthogonal and two-by-two counter-propagating. The two magnetic coils 10*a* and 10*b* contribute to the very localized focusing of the cloud of atoms 7. Following the first step of slowing-down the atoms, it is proceeded to a step of launching by effect of acceleration or free fall due to gravity, which produces a displacement of the cloud of atoms 11 propagating in the free space inside the vacuum chamber 8. The third step comprises the application of at least three successive laser pulses 12, 13 and 14 directed towards the cloud of atoms 11. The three successive laser pulses 12, 13 and 14 are localized in time and space and comprise lines of predetermined wavelengths to ensure the searched transitions. The first laser pulse 12 is configured to partially switch the atoms from the fundamental level g (ground level), in solid line, to the excited level e, in dotted line, between the two hyperfine levels of the considered alkali atom. For that purpose, it is proceeded by two-photon Raman pumping. The first pulse 12, called $\pi/2$, during the switching from the fundamental level g to the excited level e, modifies the momentum of the jet of atoms and hence deviates the latter by a certain angle. Each atom ends up in a superposition of two states: a deviated state and a non-deviated state, following different ballistic trajectories. After a certain duration, a second pulse 13, twice longer, called $\pi$, transfers all the atoms present in state e to state g. The new modification of the mechanical momentum modifies again the trajectories of the two clouds of atoms, bringing them closer to each other. Finally, after a new duration, a last laser pulse 14, also called $\pi/2$, recombines the two incident clouds of atoms. Two clouds are hence obtained, a first cloud of atoms 15 consisted of the atoms in state g having followed both trajectories, a second cloud of atoms 16 composed of the atoms in state e having also followed both trajectories. In their state, these two clouds of atoms 15 and 16 are also waves of matter in situation of complementary interferences. The phase-shift accumulated to form the situation of interference is that of the laser pulses 12, 13 and 14 at the different moments of interception, taking into account the effects of the trajectories followed. The interference state is hence directly connected to the trajectory differences acquired. The reading of the interference state is made in two times, using a new laser pulse 17 wavelength-tuned to one of the states. A photoreceptor 18 detects a fluorescence signal that results from the absorption of the laser pulse 17. A last laser pulse allows measuring a global fluorescence signal to determine the total number of atoms. The two successive measurements provide information about the relative state of interference between atoms, which allows very accurately going back to the phase.

To link steps 1 to 5, it is necessary to generate different laser pulses applied at time intervals of a few milliseconds and for durations from a few milliseconds to a few hundreds of milliseconds. The pulses of the different steps being at different optical frequencies, in other words different wavelengths, it is necessary to be able to rapidly switch between the different wavelength values, within a few milliseconds. In certain two-photon transition steps, a laser pulse having two spectral lines is applied, in order to reach the absolute values of the atomic transition lines with a relative accuracy of the order of $\Delta F/F=10^{-9}$ to $10^{-12}$. The light power contained in the involved lines must also be controlled with a good accuracy of the order of $10^{-3}$. Finally, the phase between two optical frequencies must be perfectly controlled and the noise must be lower than one mrad, mainly for interferometry (step 3).

An example will be detailed hereinafter for each step implemented in a cold-atom interferometer.

In more detail, the first step is that of trapping, confining and slowing-down the atoms. A first laser pulse is directed into a chamber within which a high vacuum is established and containing a residual vapour of alkali atoms, for example rubidium, in presence of a magnetic field. This first step constitutes the magneto-optic trap (MOT). During this first step, the wavelength of the transition $5^2S_{1/2}$=>$5^2P_{3/2}$ is split into halves and dynamically tuned to allow the transition, on the one hand, from level F=1 to level F'=2, and on the other hand, from F=2 to F'=3, according to the rules of selection governing the authorized transitions. In the example of rubidium, the two lines are hence spaced apart by 6.834-0.267=6.567 GHz. A slight additional shift towards the red, for example from 10 MHz to 20 MHz, is introduced with respect to the absorption resonance. In these conditions, the laser light can be absorbed by a rubidium atom in movement in any direction. The wavelength of the laser pulse being slightly shifted with respect to the atomic transition, by Doppler effect, the atoms in movement in the direction of the light beam are those which have the highest probability of absorption. During this process, the atom absorbs a certain momentum transferred by the photon. During the spontaneous emission that follows this absorption, the atom should, in theory, fully releases this momentum. The existence of the wavelength or optical-frequency shift nevertheless imparts a radiative transition corresponding exactly to the resonance. The atom that has undergone this shifted absorption then this centred radiation is forced to compensate for the energy difference, due to the momentum and energy conservation. The atom is hence caused to withdraw its own kinetic energy to compensate for this deficit. This loss of energy modifies and reduces its initial speed. This slowing down corresponds to a lowering of temperature of the thermal agitation of the atomic gas.

During the initial laser pulse duration, tuned to a very slightly shifted transition wavelength, all the atoms, lighted in the combination of laser beams applied in opposition according to the three axes of the Cartesian space, i.e. six beams in total, are progressively slowed down. After a few tenth of thousands of atom-photon interactions, this process allows switching from a speed dispersion of the trapped atoms of the order of 300 m/s, corresponding to the agitation of the Brownian movement at ambient temperature to 10 cm/s, in a few hundreds of nanoseconds, which corresponds to temperatures close to absolute zero. To trap a great number of atoms (of the order of $10^9$ atoms), this first step may last several hundreds of milliseconds. It is to be noted that the two laser lines 101, 102 present each have a determined light power, different from each other.

The second step 2 is shorter and lasts about ten milliseconds and aims to create what is called the optical molasse. During this second step, an additional frequency shift, for example 100 MHz with respect to the transition F=2 to F'=3, is introduced within the 6 beams. This process allows switching from a speed dispersion of the trapped atoms of the order of 10 cm/s to 1 cm/s.

The third step is the making of the interferometer. When the first laser sequence dedicated to the slowing down is stopped, the atoms can quit their position. Under certain conditions, they are characterized by an initial speed in a given and known direction. In the case of atoms submitted to gravity, it is a constant acceleration, the speed of the atoms increases linearly as a function of time. It may also be proceeded to a launching of the atoms at a known initial speed, under certain conditions. This is hence a cloud of coherent atoms that leaves its initial position. The source of atoms being thus controlled, it is possible to build an atom interferometer, whose optical element equivalents in the conventional sense of the term (splitting blades and mirrors) are consisted of a succession of laser pulses separated in time and/or in space.

It is considered that the whole cloud of atoms 11 that propagates has been initially prepared so that all the atoms are in the energy state g. In this situation, the atoms propagate according to their initial speed and are subjected to the effects of all the inertial forces acting on them (gravity, acceleration, Coriolis forces). They hence follow a ballistic trajectory, for example a parabolic trajectory in the case of the sole effect of gravity.

A first laser pulse 12, called (π/2), is applied for a duration T. The first laser pulse 12 is consisted of two lines having two distinct wavelengths allowing a so-called two-photon Raman pumping transition. The two wavelengths are spaced apart exactly by the frequency value corresponding to the hyperfine transition of 6.834 GHz in the case of rubidium. They are shifted by 1 GHz towards the low energies, at the virtual intermediate level, shifted with respect to the transition F=2 to F'=3, for example located at 1 GHz under the level F'=1. The light-matter interaction model shows that, in these conditions, after a duration T suitably chosen, according to the so-called Rabi oscillation phenomenon, each atom switches to a superposition of fundamental state g and excited state e. During this transition, the atoms that switch to state e undergo, along their trajectory, a mechanical pulse coming from the absorption of two photons, transverse or longitudinal, according to the arrangement of the interaction beam that separates them, spatially, from the atoms that stay in state g. It is to be noted that, at this step, the laser phase is transferred to the wave of the atoms switching from g to e. The first pulse (π/2) hence plays the role of splitting blade by analogy with an optical interferometer.

Following the first interaction (π/2), the two beams of atoms propagate for a certain duration $t_o$ according to the configuration of the interferometer, each along a new trajectory and always subjected to the effects of the already mentioned inertial forces.

A second laser pulse 13, called (π), of same nature and same properties as the pulse π/2, but of duration 2T, twice longer, is then applied. The second laser pulse 13 (π) has for effect to cause all the atoms that are still in the fundamental state g to switch to the excited state e, which provides them with a new mechanical pulse, longitudinal or transverse, according to the arrangement of the interaction beam, whereas the atoms that were still in the excited state e will switch back to state g by undergoing a mechanical pulse in the opposite direction, which provides them back with their initial pulse, except the effects of the inertial forces in presence. The laser transfers to the atoms a phase that depends on the trajectory of the atoms. The second laser pulse 13 (π) hence plays the role of mirror, by analogy with the optical interferometer.

A last laser pulse 14, also called (π/2), interacts with the two beams of atoms that have each followed distinct inertial trajectories. This last laser pulse 14 transfers, by two-photon pumping, half the atoms still being in the fundamental state (g) to the excited state (e), by communicating them again a mechanical pulse that laterally deviates or longitudinally delays them according to the arrangement of the beams of atoms. The last laser pulse 14 also transfers half the atoms being in the excited state (e) to the fundamental state (g), with communication of a mechanical pulse of opposite direction with respect to the first one. This last laser pulse 14 hence plays the role of output splitting blade, by analogy with that of optical Mach-Zehnder interferometer. Indeed, resulting first beam of atoms 16 and second beam of atoms 15 correspond to atoms being in state (g) for the first beam of atoms 16 and, respectively, in state (e) for the second beam of atoms 15. All the atoms have travelled at the same time along the two trajectories of the atom interferometer. It can be shown that the population normalized to 1 of the first beam of atoms 16 is a function equal to the square of the cosine of all the phase-shifts transferred by the laser during the different interactions. These phase-shifts being linked to the time-of-flight of the atoms in the interferometer, the density of this recombined beam can hence be linked to all the accelerations undergone inside the interferometer. It can also be shown that the population normalized to 1 of the second beam of atoms 15 is equal to the square of the sine of these same phase-shifts.

Counting the number of atoms in one of the beams of atoms 15 or 16, then counting the total number of atoms in both output beams of atoms 15, 16, allows recovering the output normalized interference state and calculating the total phase-shift undergone by the atoms and caused by all the accelerations they have undergone between the first laser pulse and the last laser pulse.

The counting operation is carried out by means of a first laser beam 17 strictly corresponding, in the case of rubidium, to the transition F=2 to F'=3, i.e. the 780.24 nm wavelength (step 4). The absorption causes a spontaneous emission fluorescence when the atoms are unexcited. The light power that results from this fluorescence is proportional to the square of the cosine of the searched phase-shift and can be measured by a linear photodetector. Immediately after this first measurement, a second laser line, spaced in frequency by 6.6 GHz from the first one, corresponding to the already mentioned fundamental level hyperfine transition, allows measuring by fluorescence all the atoms located both in the excited level (e) and in the fundamental level (g) (step 5). The ratio between the two fluorescence measurements hence provides the normalized value of the searched cosine function.

It is hence understood that the laser source that is generally unique for the whole experience must allow applying, at different moments and different locations in the vacuum chamber 8, laser beams whose wavelength switches rapidly and very accurately. This laser source must also be able to generate one to two lines extremely close to each other, while being absolutely referenced to the transitions of the considered alkali atom (for example, caesium, rubidium or potassium).

The publication V. Ménoret et al. "Dual-wavelength laser source for onboard atom interferometry", Optics Letters, vol. 36, no. 21, pp. 4128-4130, 2011 describes a non-tunable laser source. More recently, the publication B. Battelier et al. "Development of compact cold-atom sensors for inertial navigation", Proceedings of SPIE, Quantum Optics, vol. 9900 p. 990004, 2016 implements an optical-frequency switchable laser source system. This system uses a chain of one to several optical phase modulators and optical filters arranged in cascade and controlled by one or several sources of synchronous microwave signals. According to the state of the art, the architecture of such a laser source system based on fibre-optic components hence relies on a complex implementation of optical phase modulators. These switchable and tunable laser source systems have for drawback to generate non only the useful lines but also other spurious lines liable to harm the efficiency of reading of the output atomic interference phenomenon.

One of the objects of the invention is to propose a system for interaction between laser beam and chemical species, adapted to generate a single one or two laser lines having a predetermined optical-frequency shift of at most a few tenth of gigahertz with respect to a reference optical frequency of the chemical species considered, and to rapidly switch this optical-frequency shift. Preferably, the chemical species are atoms, ions or molecules in a vacuum space.

One of the objects of the invention is to propose a simpler and cheaper alternative architecture of cold-atom and laser-pulse interferometer system.

OBJECT OF THE INVENTION

In order to remedy the above-mentioned drawback of the state of the art, the present invention proposes a device for interaction between a laser beam and a hyperfine energy transition of a chemical species placed in a vacuum space, comprising a laser source adapted to emit a source laser beam at an initial optical frequency.

More particularly, it is proposed according to the invention a device further including a single sideband electro-optic modulator comprising an input optical waveguide adapted to receive the source laser beam and an output optical waveguide adapted to generate an output laser beam, the electro-optic modulator having a first high-frequency electrode, another high-frequency electrode and a plurality of low-frequency electrodes, a low-frequency voltage generator, configured to apply on each of said low-frequency electrodes a low-frequency voltage adapted to generate a predetermined optical phase-shift in the optical waveguide, and an electronic system comprising a clock, the electronic system being adapted to generate a first electrical signal modulated at a first pulse and, respectively, another electrical signal modulated at the first pulse, synchronized by the clock, the electronic system being adapted to amplitude and phase-tune the first modulated electrical signal with respect to the other electrical signal modulated at the first pulse, the electronic system being adapted to simultaneously apply the first electrical signal modulated at the first pulse to the first high-frequency electrode and, respectively, the other electrical signal modulated at the first pulse to the other high-frequency electrode, and the electronic system being adapted to switch and tune the first pulse in a microwave spectral range extending over at most 100 gigahertz so as to frequency-switch the output laser beam to a first optical frequency shifted by the first pulse with respect to the initial optical frequency while attenuating the output laser beam at the initial optical frequency and at the other harmonics of the first pulse with respect to the initial optical frequency.

Advantageously, the electronic system is adapted to generate a second electrical signal modulated at a second pulse and, respectively, another electrical signal modulated at the second pulse, the second modulated electrical signal and the other electrical signal modulated at the second pulse being synchronized by the clock, the electronic system being adapted to amplitude and phase-tune the second electrical signal modulated at the second pulse with respect to the first electrical signal modulated at the first pulse and to form a first electrical signal double-modulated at the first pulse and the second pulse, the electronic system being adapted to amplitude and phase-tune the other electrical signal modulated at the second pulse with respect to the other electrical signal modulated at the first pulse and to form another electrical signal double-modulated at the first pulse and the second pulse, and the electronic system being adapted to electrical phase-shift-tune the first double-modulated electrical signal with respect to the other double-modulated electrical signal, and the electronic system being adapted to simultaneously apply the first double-modulated electrical signal to the first high-frequency electrode and, respectively, the other double-modulated electrical signal to the other high-frequency electrode, and the electronic system being adapted to switch and tune the second pulse in a microwave spectral range extending over at most 100 gigahertz so as to frequency-switch the output laser beam simultaneously to the first optical frequency shifted by the first pulse with respect to the initial optical frequency and to a second optical frequency shifted by the second pulse with respect to the initial optical frequency, the first shifted optical frequency and the second shifted optical frequency being shifted in the same direction with respect to the initial optical frequency, while attenuating the output laser beam at the other harmonics of the second pulse with respect to the initial optical frequency.

Other non-limitative and advantageous features of the device according to the invention, taken individually or according to all the technically possible combinations, are the following:

- the electronic system includes a radiofrequency electronic synthesizer adapted to generate an electrical signal modulated at the first pulse and a hybrid coupler having a first output channel and a second output channel, the first output channel being electrically connected to the first high-frequency electrode and, respectively, the second output channel being electrically connected to the other high-frequency electrode, the hybrid coupler being adapted to receive the electrical signal modulated at the first pulse and to generate the first electrical signal modulated at the first pulse on the first output channel and, respectively, the other electrical signal modulated at the first pulse, in phase-quadrature, on the second output channel;
- the radiofrequency electronic synthesizer is adapted to generate an electrical signal modulated at the second pulse, the hybrid coupler being adapted to receive the electrical signal modulated at the second pulse and to generate the second electrical signal modulated at the second pulse on the first output channel and, respectively, the other electrical signal modulated at the second pulse, in phase-quadrature, on the second output channel;
- the device further comprises a non-linear optical component arranged to receive the output laser beam at the first optical frequency shifted by the first pulse with respect to the initial optical frequency and/or at the second optical frequency shifted by the second pulse with respect to the initial optical frequency, the non-linear optical component being adapted to generate a laser beam at an optical frequency equal to twice the first shifted optical frequency, at an optical frequency equal to twice the second shifted optical frequency and/or, respectively, at an optical frequency equal to the sum of the first shifted optical frequency and of the second shifted optical frequency;
- the device further comprises an optical switch, the optical switch having an input path and a plurality of output paths, the optical switch being adapted to receive on the input path and to direct to one of the output paths the output laser beam at the first optical frequency shifted by the first pulse with respect to the initial optical frequency, the output laser beam at the second optical frequency shifted by the second pulse with respect to the initial optical frequency, the laser beam at the optical frequency equal to twice the first shifted optical frequency, the laser beam at the optical frequency equal to twice the second shifted optical frequency and/or, respectively, the laser beam at the optical frequency equal to the sum of the first shifted optical frequency and of the second shifted optical frequency;
- the device comprises an electronic feedback loop comprising a photodetector, an electrical source and a signal mixer, the photodetector being adapted to measure a signal of absorption by the chemical species of the output laser beam at the first shifted optical frequency, at the second shifted optical frequency, of the laser beam at the optical frequency equal to twice the first shifted optical frequency, of the laser beam at the optical frequency equal to twice the second shifted optical frequency and/or, respectively, of the laser beam at the optical frequency equal to the sum of the first shifted optical frequency and of the second shifted optical frequency, the electrical source being adapted to generate a low-frequency signal and the signal mixer being adapted to mix the absorption signal and the low-frequency signal to form an error signal;

the electronic feedback loop is configured to intermittently apply the error signal to the laser source so as to tune the initial optical frequency to a reference hyperfine energy transition of the chemical species;

the electronic feedback loop is configured to intermittently apply the error signal to the electronic system so as to tune the first pulse and/or the second pulse;

the laser source comprises a semiconductor laser or a fibre-optic laser.

The invention also proposes a cold-atom and laser-pulse interferometer comprising a device according to one of the described embodiments, wherein the chemical species is consisted of atoms and the radiofrequency electronic synthesizer is adapted to switch the first pulse and the second pulse according to a predetermined sequence.

The invention also proposes a hyperfine optical spectrometry apparatus comprising a device according to one of the described embodiments, wherein the chemical species is consisted of atoms, ions or molecules, and comprising a detector adapted to measure a hyperfine energy transition of the chemical species by absorption, reflection or scattering of the frequency-shifted laser beam.

The invention also proposes a method for interaction between a laser beam and a hyperfine energy transition of a chemical species comprising the following steps:

confining the chemical species in a vacuum space, emitting a source laser beam at an initial optical frequency, injecting the source laser beam to an input optical waveguide of a single sideband electro-optic modulator, generating a first electrical signal modulated at a first pulse synchronized to a clock and, respectively, another electrical signal modulated at the first pulse synchronized to the clock, the first pulse being switchable and tunable in a microwave spectral range extending over at most 100 gigahertz, amplitude and phase-tuning the first modulated electrical signal with respect to the other electrical signal modulated at the first pulse, simultaneously applying the first electrical signal modulated at the first pulse to a first high-frequency electrode of the electro-optic modulator and, respectively, the other electrical signal modulated at the first pulse to another high-frequency electrode of the electro-optic modulator so as to selectively generate, on an output optical waveguide of the electro-optic modulator, an output laser beam at a first optical frequency shifted by the first pulse with respect to the initial optical frequency while attenuating the laser beam at the initial optical frequency and at the other harmonic frequencies of the first pulse with respect to the initial optical frequency, and optically amplifying the output laser beam to generate a laser beam amplified at the first shifted optical frequency, and transmitting the first laser beam amplified at the first shifted optical frequency towards the chemical species, for it to interact with a hyperfine energy transition of the chemical species.

Preferably, the method further comprises the following steps:

generating a second electrical signal modulated at a second pulse synchronized to the clock and, respectively, another electrical signal modulated at the second pulse synchronized to the clock, the second pulse being switchable and tunable in a microwave spectral range extending over at most 100 gigahertz, amplitude and phase-tuning the second electrical signal modulated at the second pulse with respect to the first electrical signal modulated at the first pulse to form a first electrical signal double-modulated at the first pulse and the second pulse, and amplitude and phase-tuning the other electrical signal modulated at the second pulse with respect to the other electrical signal modulated at the first pulse to form another electrical signal double-modulated at the first pulse and the second pulse, electrical phase-tuning the first double-modulated electrical signal with respect to the other double-modulated electrical signal, simultaneously applying the first double-modulated electrical signal to the first high-frequency electrode of the electro-optic modulator and, respectively, the other double-modulated electrical signal to the other high-frequency electrode of the electro-optic modulator so as to generate on the output optical waveguide of the electro-optic modulator an output laser beam simultaneously switched to the first optical frequency shifted by the first pulse with respect to the initial optical frequency and to a second optical frequency shifted by the second pulse with respect to the initial optical frequency, the first shifted optical frequency and the second shifted optical frequency being shifted in the same direction with respect to the initial optical frequency, optically amplifying the output laser beam to generate a laser beam simultaneously amplified at the first shifted optical frequency and at the second shifted optical frequency, and transmitting the laser beam simultaneously amplified at the first shifted optical frequency and at the second shifted optical frequency towards the chemical species.

DETAILED DESCRIPTION OF AN EXEMPLARY EMBODIMENT

The following description in relation with the appended drawings, given by way of non-limitative examples, will allow a good understanding of what the invention consists of and of how it can be implemented.

Figure 4:
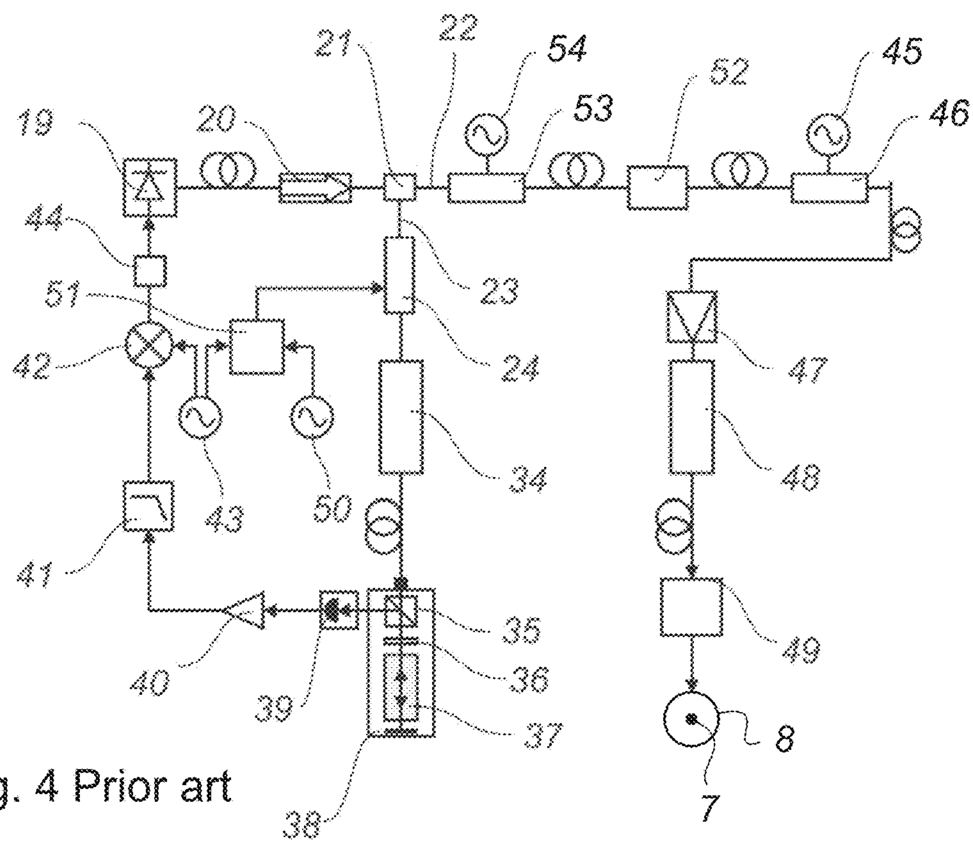
Figure 5:
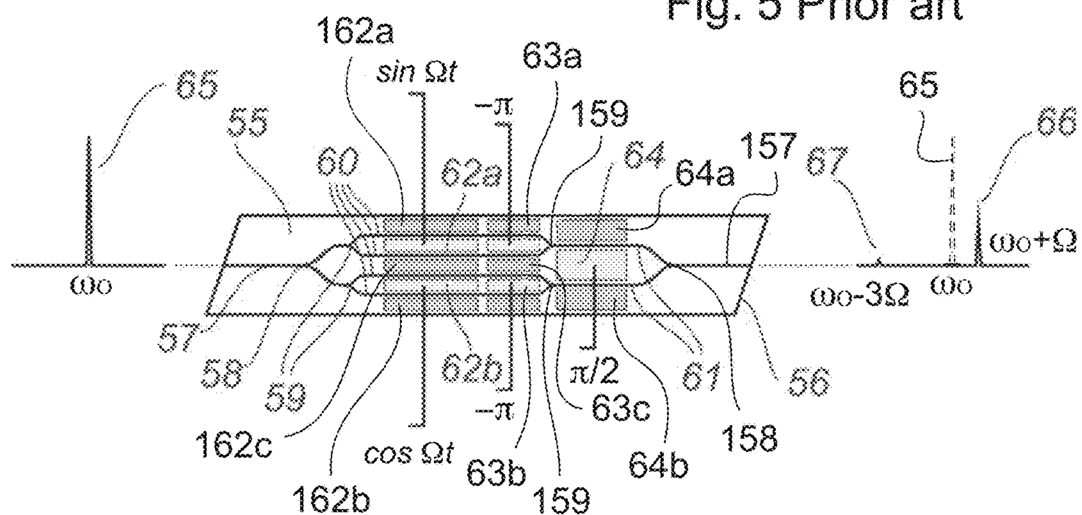
Figure 6:
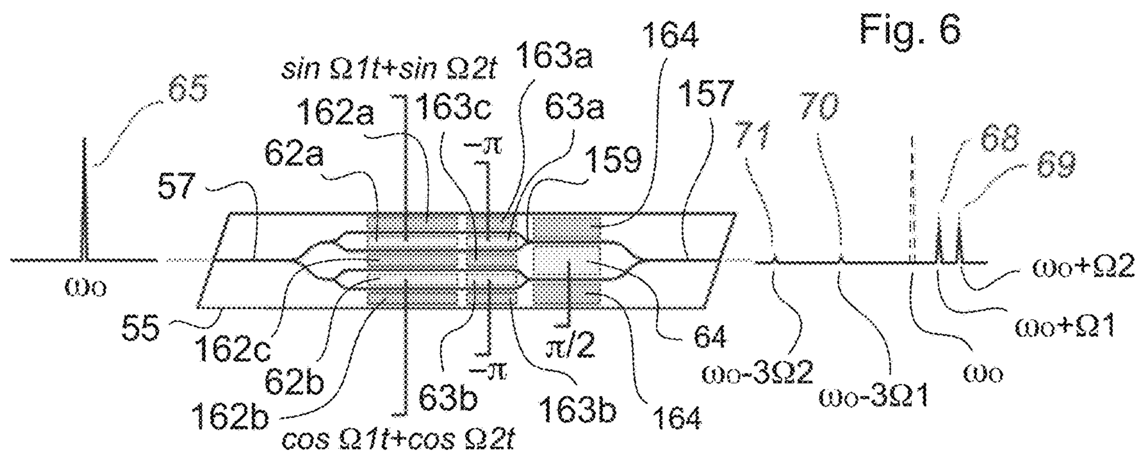
Figure 7:
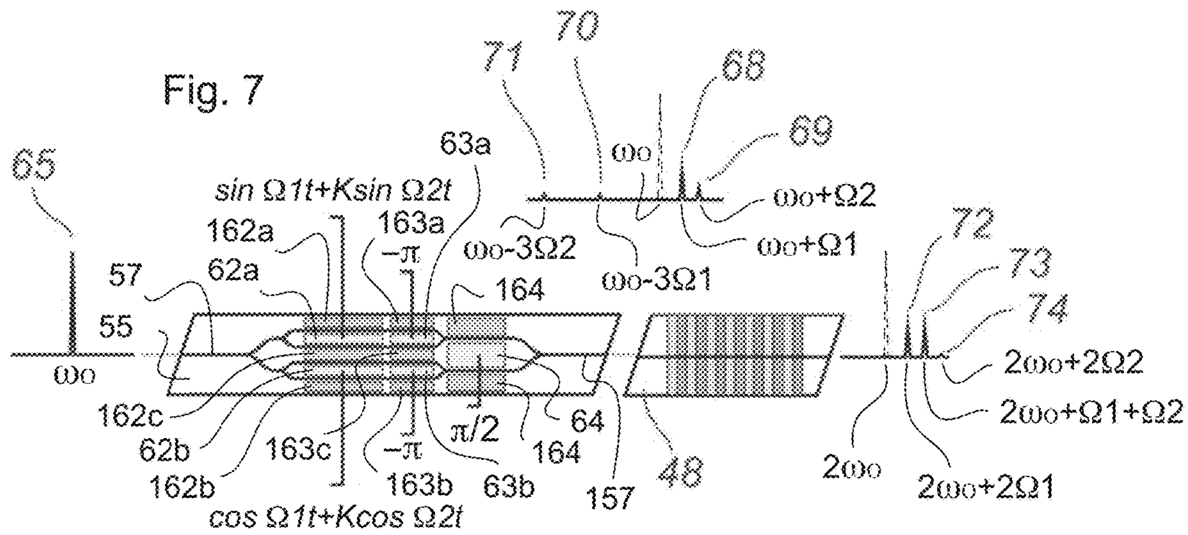
Figure 8:
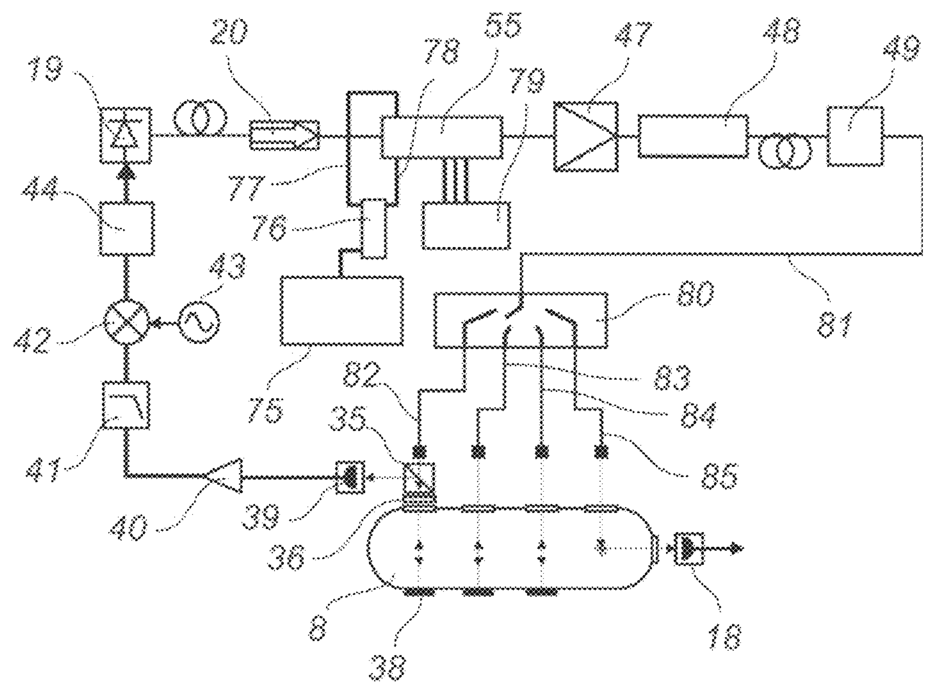
Figure 9:
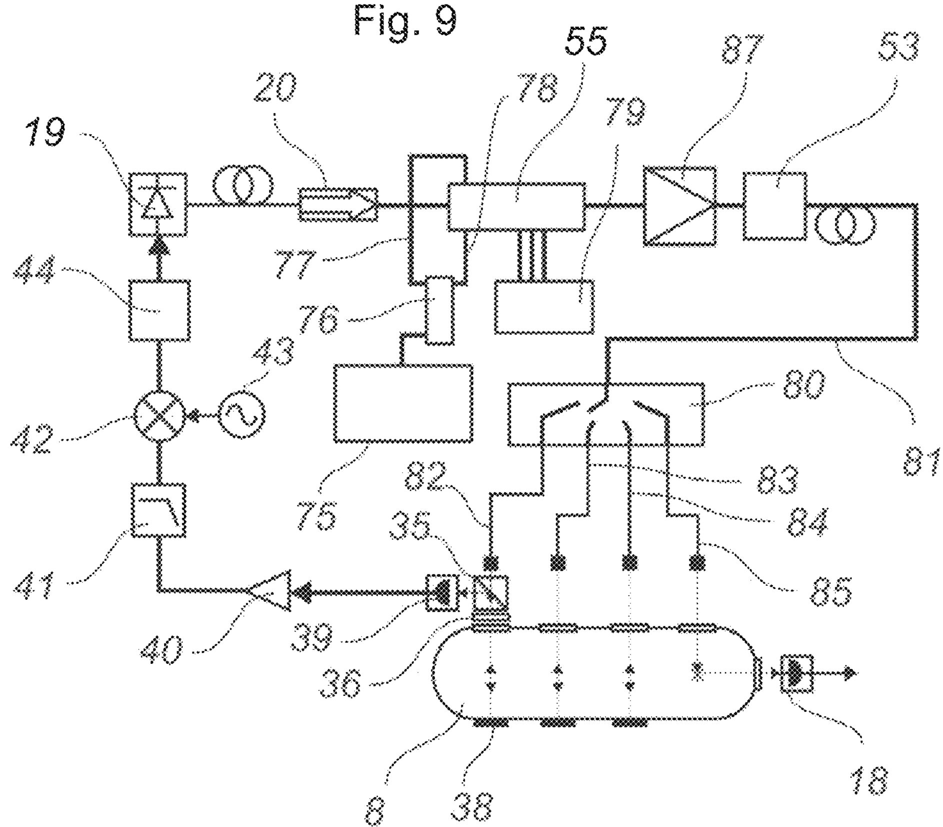
Figure 10:
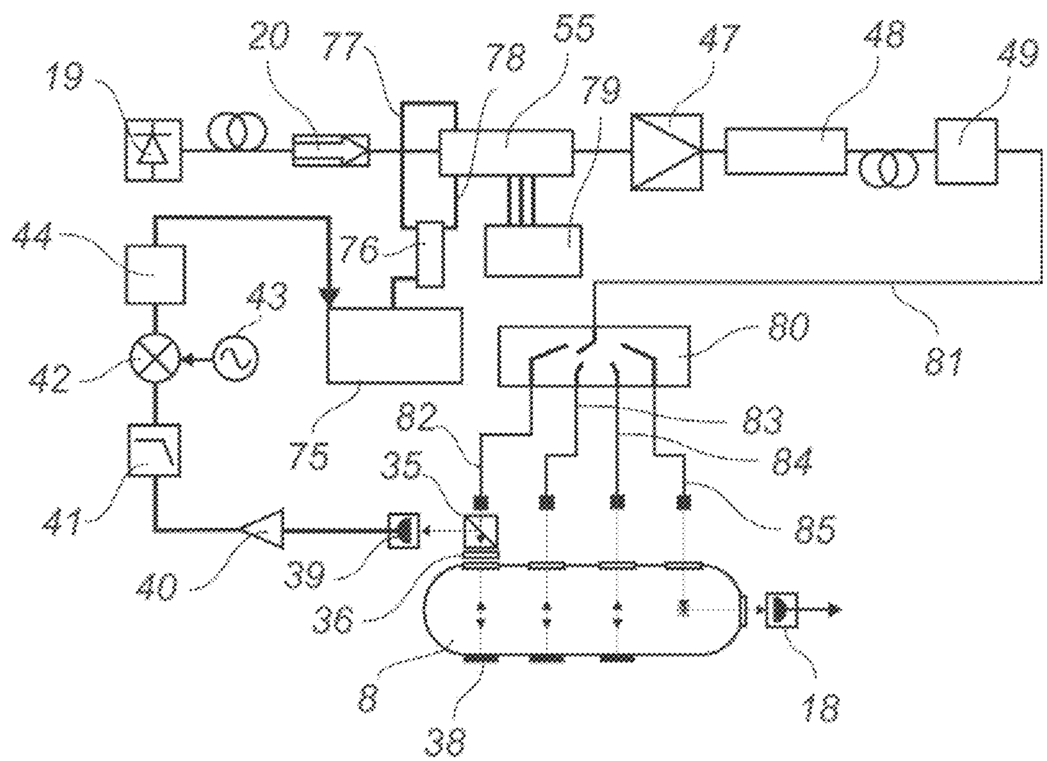
Figure 11:
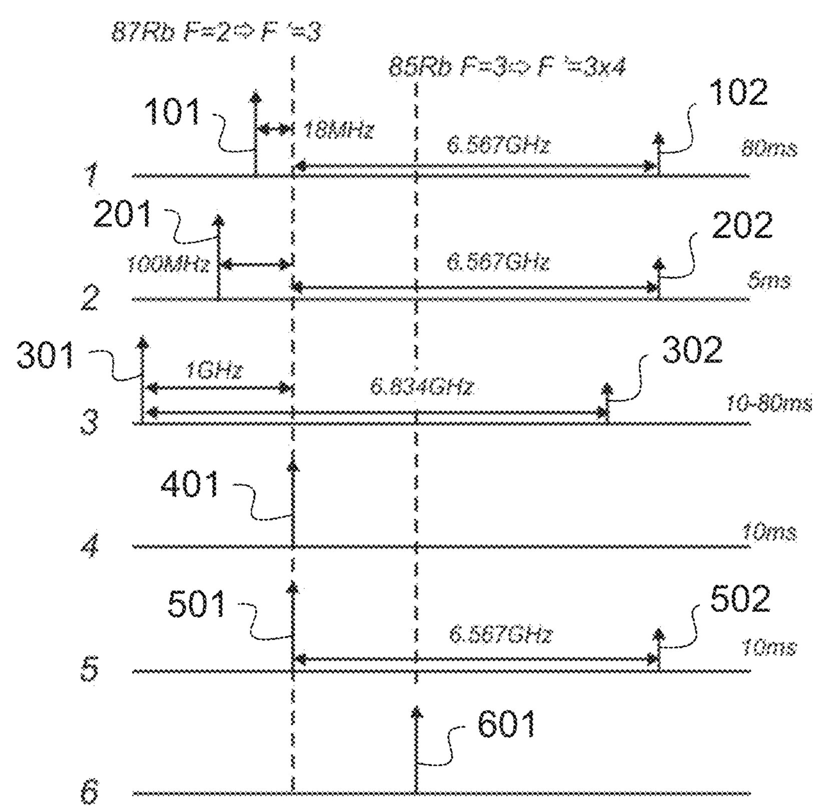

In the appended drawings:

FIG. 1 schematically shows the energy levels and hyperfine sub-levels of the rubidium-87 atom (transition D2);

FIG. 2 schematically shows a vacuum chamber configured for an interferometry experiment with cold atoms;

FIG. 3 schematically shows a switchable laser source system for a cold-atom interferometric system according to the prior art, this laser source system being based on the use of two semiconductor lasers in master-slave mode;

FIG. 4 schematically shows another switchable laser source system for a cold-atom interferometric system according to the prior art, this laser source system being based on the use of a single laser source, several phase modulators arranged in cascade and a tunable optical filter;

FIG. 5 schematically shows in top view a single sideband electro-optic modulator intended to be used in a cold-atom manipulation system by interaction with a laser beam, to frequency-shift the source laser beam to an optical frequency shifted with respect to the initial optical frequency;

FIG. 6 schematically shows the electro-optic modulator used in a cold-atom manipulation system by interaction with a laser beam according to the present disclosure in which the single sideband EO modulator is used to switch and split the laser beam simultaneously towards a first optical frequency shifted by a first microwave pulse $\Omega_1$ and, respectively, a second optical frequency shifted by a second microwave pulse $\Omega_2$ with respect to the initial optical frequency;

FIG. 7 schematically shows a sub-module of cold-atom interferometric system combining a single sideband electro-optic modulator and a frequency-doubling non-linear optical component;

FIG. 8 schematically shows an agile laser source system according to an exemplary embodiment;

FIG. 9 schematically shows an agile laser source system according to another exemplary embodiment;

FIG. 10 schematically shows an agile laser source system according to still another exemplary embodiment;

FIG. 11 schematically shows a method of laser-atom interaction comprising the steps of: atom cooling (step 1), formation of an optical molasse (step 2), and, in the applications of atomic interferometry (step 3), laser fluorescence detection (step 4), counting of the total number of atoms (step 5) and sounding of an atomic transition line (step 6), as well as the optical frequencies involved in each of these different steps in the example of the rubidium atom.

DEVICE

In FIG. 3 is shown an optical-frequency tunable or switchable laser source system for a cold-atom interferometric system according to the prior art. This laser source system is based on an architecture with two semiconductor laser sources 19 and 29 operating in master-slave mode.

The laser source system comprises a first laser source 19 or main laser. The first laser source 19 is for example a semiconductor-based source integrated in a structure of the distributed Bragg reflector (DBR) type. The first laser source 19 emits continuously a source laser beam that has a very high line fineness (a few kHz). A modification of the temperature of the Bragg reflector associated with the laser allows tuning the wavelength of the source laser beam. An optical isolator 20 receives the source laser beam and allows limiting the spurious light reflection towards the source laser in order to avoid any instability.

An optical coupler 21 having an input branch and two output branches 22 and 23 receives the source laser beam transmitted by the optical isolator 20. The optical coupler 21 is preferably a fibre-optic coupler. The optical coupler 21 splits the source laser beam into a portion transmitted on the output branch 22 and another portion transmitted on the other output branch 23, which is used for the permanent locking of the first laser source 19 to a second reference laser source 29. For that purpose, the second laser source 29 is connected to another optical isolator 30 then to another optical coupler 31 having an input branch and two output branches 32 and 33. Let's consider the branch 33 intended for controlling a determined reference atomic line. The second laser source 29 emits a light beam that is transmitted on the branch 33 towards a non-linear optical component 34, for example of the PPLN (Periodically Poled Lithium Niobate) type, which, by non-linear optical effect, carries out second harmonic generation and hence optical frequency doubling. In other words, the wavelength of the second harmonic beam is equal to half the source beam wavelength. The second semiconductor laser source 29 emits a source line about 1560 nm. The non-linear optical component 34 converts the 1560 nm source line into a second harmonic line located about 780 nm, which is close to the transition line of rubidium. The 780 nm beam passes through an optical beam-splitter cube 35, then a quarter-wave plate 36 in order to obtain a circular polarization state. The circularly polarized second-harmonic beam lights a low-pressure cell 37 containing a rubidium gas, in the present example. A mirror 38 reflects the second-harmonic beam towards the beam splitter 35. The reflected beam lights a photodiode 39 that generates an absorption signal that is amplified by an electronic signal amplifier 40. An electrical source 43 generates a low-frequency signal. A signal mixer 42 mixes the low-frequency signal with the amplified absorption signal and the mixed signal is then filtered by a low-pass electronic filter 41. The low-pass electronic filter 41 generates an error signal that is integrated by a feedback electronic component 44 before being applied to the second laser source 29 to correct the wavelength of the emitted beam. Hence, the laser beam emitted by the second laser source 29 is perfectly tuned on a transition or an absorption line of rubidium, during its double passage through the low-pressure cell 37. Hence, the second laser source 29 is continuously and absolutely locked with respect to the value of the searched transition for the considered atom.

The second reference laser source 29 is used for the servo-control to a spectral absorption line of the alkali atom (rubidium, for example) implemented in the experiment. According to the prior art, this continuous servo-control step is essential for the following of the operations.

Another optical coupler 24 having two input branches formed by the branches 23, 32 and an output branch is arranged in such a way to servo-control the main laser 19 to the second laser source 29. The input branch 23 receives a laser beam coming from the main laser 19. The other input branch 32 receives another laser beam emitted by the reference laser 29. The optical coupler 24 mixes these two beams. On the output branch of the second optical coupler 24, a photodetector 25 detects a beat signal that is amplified by an electronic signal amplifier 26. A feedback frequency-phase comparator circuit 27 receives, on the one hand, a frequency generally equal to a fraction (for example, a by factor 2 or 8) of the optical frequency coming from the beat between the two shifted optical frequency waves and, on the other hand, a carrier coming from a radiofrequency (RF) electrical source 28. The circuit 27 generates an error signal that is applied to the main laser 19 to tune the searched wavelength, shifted with respect to the second laser source 29 by a predetermined value by the electrical source 28. Other wavelength locking schemes are also possible with variants.

The main laser 19 is hence servo-controlled to a wavelength slightly shifted with respect to the reference line of rubidium, by this master-slave locking system. The other output branch 22 of the optical coupler 21 is intended to an experiment chamber for an atomic interferometry on rubidium atoms. On the output branch 22 are arranged in series an optical phase modulator 46, an optical amplifier 47, a second non-linear optical component 48 and a last amplitude modulator 49. The optical phase modulator 46 is driven by a synthesizer 45 providing a microwave carrier. At the output of the optical phase modulator 46, a modulated beam is obtained, which comprises sidelines generated about the optical frequency of the main laser 19. The optical amplifier 47 then allows tuning the optical power level to have the required number of photons at the system output. The second non-linear optical component 48 of the frequency-doubling PPLN type allows second harmonic generation from the lines contained in the modulated beam. The last amplitude modulator 49, for example of the acousto-optic type, allows controlling the switching of the beams intended to light an experiment chamber containing the cloud of cold atoms, as illustrated for example in FIG. 2.

FIG. 3 represents a first architecture of tunable laser source system for atomic interferometer based on the use of a master-slave mode two-laser system, one of the lasers 29 being continuously locked on the absorption of a reference atomic line and the other laser 19 being frequency-shifted by means of a mixer and comparator circuit with respect to this reference optical frequency, a phase modulator 46 allowing the generation of sidelines from this shifted source.

Hence, the source system of FIG. 3 allows generating one to two sidelines from a single laser line to perform a sequence of steps as shown in FIG. 2. The master-slave two-laser source system is permanently reconfigurable, which allows a particularly agile, that is to say both rapid and very accurate, optical-frequency switching of the laser lines.

However, the master-slave two-laser source system requires at least two semiconductor lasers 19, 29. Moreover, the management of the wavelength control between the two semiconductor lasers involves a complex implementation. Indeed, the optical phase modulator 46 is necessary to introduce the sidelines and hence reach the searched result. Now, the optical phase modulator 46 generates not only the searched sidelines, but also undesirable sidelines on the higher harmonics at power levels that are generally not negligible. These undesirable harmonics constitute spurious interferometer sources and are sources of errors in the output signal, in other words the interference signal measured. By way of example, let's consider the case of a phase modulator driven by a microwave source at 6.8 GHz (case of rubidium) of power voltage amplitude $V_0$. The modulation index is equal to $\pi V_0/V_\pi$, where $V_\pi$ is the half-wave voltage of the modulator, i.e. the power voltage adapted to introduce a phase-shift of $\pi$ radians on the optical wave that passes through it. It results therefrom that a part of the energy is converted in a line located at +6.8 GHz of the initial optical frequency $\omega_o$, which is the searched effect. The power ratio between the initial optical frequency $\omega_o$ and the shifted sideband of the first microwave pulse is equal to 1 when the modulation index is equal to 1.43. It must however be noticed that other lines are also created at this occasion at the harmonic frequencies of the central line, that is to say at −6.8 GHz, but also at ±13.4 GHz, ±20.4 GHz etc.

In these conditions, it may be noticed the appearance of a significant spurious line at −6.8 GHz of amplitude equal to the useful sideband at +6.8 GHz. The power amplitude of the other additional lines, in particular at ±13.4 GHz, is equal to 40% of that of the lines at ±6.8 GHz, which is not negligible. These spurious lines of non-negligible amplitude are liable to significantly limit the performances of the cold-atom interferometer.

FIG. 4 illustrates another example of a laser source system for driving a cold-atom interferometer experiment according to the recent prior art (B. Battelier et al., "Development of compact cold-atom sensors for inertial navigation", Quantum Optics, Proc. SPIE, Vol. 9900, 990004, 2016). The system of FIG. 4 is based on the use of a single semiconductor laser 19 and a cascade of optical phase modulators to shift a laser line with respect to an atomic reference, then to generate multiple different searched sidelines.

The architecture of the system of FIG. 4 includes a laser source 19, for example a semiconductor laser, which emits a source laser beam at an initial optical frequency. An optical isolator 20 receives the source laser beam via an optical fibre. An optical coupler 21 having an input branch and two output branches 22 and 23 receives the source laser beam transmitted by the optical isolator 20. The branch 23 of the coupler 21 is used for the continuous servo-control of the laser source 19 to an atomic line of the considered atom. The output branch 23 is connected to a first optical phase modulator 124, driven by a microwave source 50 and/or by a low-frequency source 43, combined in a signal mixer 51. The modulated light then passes through a non-linear optical component 34, which, by non-linear optical effect, performs second harmonic generation. The output of the phase modulator 124 is connected to a first non-linear optical component 34 of the frequency-doubler PPLN (Periodically Poled Lithium Niobate) type. The lines modulated at 1560 nm are hence converted into lines about 780 nm, which corresponds to the transition line of rubidium, in the considered example. The 780 nm beam passes through an optical beam-splitter cube 35, then a birefringent plate 36 of the quarter-wave plate type in order to obtain a circular polarization state. The circularly polarized, 780 nm beam lights a low-pressure absorption cell 37 containing a rubidium gas. A reflecting mirror 38 reflects the 780 nm beam to the beam splitter 35. The reflected beam lights a photodiode 39 that generates an absorption signal that is amplified by an electronic signal amplifier 40. An electrical source 43 generates a low-frequency signal. A signal mixer 42 mixes the low-frequency signal with the amplified absorption signal and a low-pass electronic filter 41 filters the obtained signal, which generates an error signal. A feedback electronic component 44, also called integrator, applies the error signal to the semiconductor laser 19 to accurately tune the wavelength emitted by the laser source 19 to the searched rubidium atomic transition. Hence, the semiconductor laser source 19 is absolutely locked and referenced to this value. In other words, the laser source 19 is wavelength servo-controlled to a reference atomic transition.

The other output branch 22 of the coupler 21 is connected to a second phase modulator 53 controlled by a synthesizer 54 generating an electrical signal modulated at a first microwave pulse to produce a first spectral shift of the laser line. The so-driven phase modulator 53 phase-modulates the light of the laser source 19 and creates sidebands.

The phase-modulated light shows several sidelines. A narrow spectral band, tunable optical filter 52, for example a Fabry-Perot filter, allows selecting a main line among these sidelines, which is equivalent to optical-frequency translating or shifting the line of the laser source 19 with respect to the reference atomic transition.

A third optical phase modulator 46 is placed in cascade after the tunable filter 52. The optical phase modulator 46 is driven by another microwave source 45 that allows generating a second optical frequency shifted with respect to the main line, similarly to the optical modulator 46 described in relation with FIG. 3. This third optical phase modulator 46 is followed by an optical amplifier 47, a second non-linear optical component 48 of the frequency-doubler PPLN type and an optical amplitude modulator 49.

The tunable and switchable source system of FIG. 4 allows shifting the optical frequency of a laser line from an atomic reference, and then generating multiple sidelines at predetermined optical frequencies, which is equivalent to translating or shifting the optical frequency of the initial laser source.

The laser source system of FIG. 4 allows creating one or two sidelines from a single laser line. This configuration allows a great agility of switching of the spectral lines. This laser source system of FIG. 4 reaches it, in this description, by means of a cascade of two optical phase modulators 53 and 46, between which is interposed an optical filter 52 making it possible to select a first line, variable in position with respect to the reference. The second phase modulator 46 is necessary to introduce other sidelines and to reach the searched result. However, this configuration is, one the one hand, complex to implement, and on the other hand, requires an additional tunable optical filter of the Fabry-Perot type. This configuration is expensive. Moreover, this laser source system for atomic interferometer generates a great number of spurious lines causing an error on the measurement and a loss of efficiency of the laser source system.

To sum up, the laser source system for cold-atom interferometer of FIG. 3 is based on the use of two semiconductor lasers interlocked with each other in a master-slave mode. The laser source system for cold-atom interferometer of FIG. 4 requires a plurality of phase modulators intended to generate sidelines, which are subsequently filtered, then split again to allow obtaining a comb of frequency-shifted lines with a rapid switching capacity. Nevertheless, these systems generate far more lines than necessary. These undesirable lines can generate spurious interactions, for example spurious interferometers that are sources of errors in the interpretation of the atomic interference phenomenon that is searched to be measured.

The present disclosure proposes a laser source system architecture for interacting with chemical species, based on a combination of a single laser source 19 and a single electro-optic modulator 55, called a single sideband (SSB) modulator. This agile laser source system finds applications, in particular, in a laser-interaction chemical species manipulation system, as for example a cold-atom interferometer.

A single sideband (SSB) electro-optic modulator is known and applied in the field of optical telecommunications, in which the optical beams have a wavelength of 1550 nm and are located in power and energy ranges that are limited and much lower than the powers and energies required for the applications of interaction between laser beam and chemical species, for example in atomic interferometry. A single sideband (SSB) electro-optic modulator is used in the prior art to switch an initial optical frequency to one and only one other optical frequency as a function of a modulated electrical signal applied, hence the name of single sideband (SSB) electro-optic modulator.

However, steps 1, 2 and 5 of interaction between cold atoms and laser do not require the simultaneous application of only one optical frequency shifted with respect to an atomic transition, but the simultaneous application of two optical frequencies shifted in a predetermined and very accurate manner with respect to a reference optical frequency, each shifted optical frequency having moreover a controlled amplitude. In atomic interferometry, step 3 also requires the simultaneous application of two shifted optical frequencies.

In the device for interaction between laser beam and chemical species, for example of laser-cold atom interaction, according to the present disclosure, only one single sideband electro-optic modulator advantageously replaces several optical phase modulators, additional optical filter(s) and/or laser diode(s) of the tunable laser source systems for cold-atom interferometer of the prior art.

The use of a single sideband electro-optic modulator according to the present disclosure allows producing selectively one or two light lines useful to the processes involved while guaranteeing a strong rejection of all the undesirable spurious lines.

FIG. 5 shows an electro-optic modulator 55 of the QPSK (quadrature phase shift keying), also I&Q or, finally, SSB (Single Sideband) type. The SSB electro-optic modulator 55 is made by integration into a monocrystalline substrate 56 having non-null electro-optic coefficients, for example made of X-cut lithium niobate ($LiNbO_3$). Let's note that the Z-cut of the lithium niobate crystal is also an alternative. Other materials are possible for this application, in particular lithium tantalite ($LiTaO_3$), indium phosphide (InP), gallium arsenide (GaAs), electro-optic polymers or also silicon in certain configurations.

In the present description, by way of non-(imitative illustration example, a substrate of lithium niobate (X-cut $LiNbO_3$) is chosen. The electro-optic modulator 55 includes a complex integrated optical circuit of optical waveguides. More precisely, the electro-optic modulator 55 includes two Mach-Zehnder interferometers arranged in parallel, hereinafter called secondary Mach-Zehnder interferometers, themselves contained in a so-called primary Mach-Zehnder interferometer. The primary Mach-Zehnder interferometer includes an input optical waveguide 57 followed with a first Y-junction 58, splitting the input optical waveguide 57 into two first parallel branches. On each parallel branch of the primary interferometer is formed a secondary Mach-Zehnder interferometer. For that purpose, two other Y-junctions 59 each split one of the two parallel branches of the primary interferometer to form in total four parallel arms 60. After a certain length, each pair of arms 60 is ended by another Y-junction 159. At the output of two Y-junctions 159 are located the two parallel branches 61 of the primary interferometer. A last Y-junction 158 joins the two parallel branches 61 to form an output optical waveguide 157. Electrodes are arranged on either side of the optical waveguides in order to allow the application of a power voltage that, by electro-optical effect in the crystal, modifies the refraction index of the material, which, by direct consequence, modulates the phase of the light guided in the different arms. Each secondary Mach-Zehnder interferometer is provided with RF electrodes 62*a* and 62*b* for the application of a microwave signal to each secondary Mach-Zehnder interferometer and with side electrodes 162*a*, 162*b*, 162*c* connected to the ground. Each secondary Mach-Zehnder interferometer may also be equipped with low-frequency electrodes 63*a*, 63*b* allowing the application of a DC voltage in order to tune the static phase between the arms 60, and the side electrodes 163*a*, 163*b*, 163*c* connected to the ground. The primary interferometer also comprises low-frequency electrodes 64*a*, 64, 64*b* allowing the tuning of the static phase between the outputs of the two secondary Mach-Zehnder interferometers.

A monochromatic laser source generates a laser beam 65 of optical frequency $\omega_O$ schematically represented by a line in FIG. 5. The line 65 represents the initial laser beam. The laser beam 65 is optically coupled in the input waveguide 57 of the electro-optic modulator 55.

A bias voltage, preferably a DC voltage, is applied to the electrode 63*a*, 63*b* of each secondary Mach-Zehnder interferometer. Advantageously, the bias voltage is tuned in such a way to introduce a phase-shift of $-\pi$ radians between the arms 60 of each secondary Mach-Zehnder interferometer.

This is equivalent to placing each secondary Mach-Zehnder interferometer in an off-state for the transmission at rest of the incident light. This optical phase-shift of $-\pm\pi$ has for effect to cancel the component of the optical signal at the initial optical frequency, in other words to eliminate the beam at the initial optical frequency $\omega_O$ on the output waveguide 157. A voltage is then applied to each electrode 62*a* and 62*b*, at a microwave pulse Ω, for example of 6.8 GHz×2π. The microwave-pulse modulated electrical signal is applied so as to be in electrical phase-quadrature between the two secondary Mach-Zehnder interferometers. Preferably, a microwave-pulse modulated electrical signal of the form sin(Ωt) is applied to the electrode 62*a* and, respectively, a microwave signal of the form cos(Ωt) is applied to the electrode 62*b*, where Ω represents a microwave pulse. The respective amplitudes of the microwave-pulse modulated electrical signals applied to the two secondary Mach-Zehnder interferometers are identical. Moreover, the voltage applied to the electrode 64 of the primary Mach-Zehnder interferometer in order to apply an optical phase shift of π/2 between the outputs of the two secondary Mach-Zehnder interferometers is tuned. At the output of the electro-optic modulator 55, an output laser beam having a single sideline 66 centred on an optical frequency ωo+Ω is hence obtained. The phase switch of the primary Mach-Zehnder interferometer from +π/2 to −π/2 produces a switching of the optical frequency of the output laser beam from ωo+Ω to ωo−Ω. In other words, the electro-optic modulator 55 allows shifting the optical frequency of the laser beam by a shift equal to the absolute value of the microwave pulse Ω with respect to the initial optical frequency wo of the incident laser beam of the SSB modulator 55 while eliminating the beam at the initial optical frequency wo at the output of this SSB modulator 55. There exists an optimum amplitude of the microwave-pulse modulated electrical signal applied to the electrodes 62*a*, 62*b* allowing the relative amplitude of the so-created single sideline 66 to be maximized. At its maximum, the sideline 66 has a power equal to 33.8% of the power contained in the line 65 of the laser beam of optical frequency wo incident on the electro-optic modulator 55. Moreover, this laser line 65 at the optical frequency wo is fully attenuated at the output of the electro-optic modulator 55. The rejection rate of the line 65 is of the order of −30 dB, independently of the amplitude of the microwave-pulse modulated electrical signals applied, contrary to what occurs with an optical phase modulator, where many spurious lines appear. More generally, it is observed that all the orders located on the lines of pair order are eliminated, with a rejection rate of −50 dB, i.e. the lines at the optical frequencies ωo±2mΩ, where m represents a natural integer m=0, 1, 2 . . . . Hence, almost a single residual sideline 67 remains at the optical frequency ωo−3Ω, whose relative power represents about 3% of the power of the sideline 66 centred to ωo+Ω. The electro-optic modulator 55 hence allows a very significant improvement relating to the rejection of residual lines unlike an electro-optic phase modulator that generates a multitude of undesirable spurious lines at all the harmonics of the modulation, and whose main spurious line has a relative power of 100% with respect to the useful sideband and whose other closest sidelines are located at ωo±2Ω and have a relative power of 40% of the two sidelines located at ωo±Ω.

The application of a modulated electrical signal of single microwave-pulse Ω on the electrodes 62*a*, 62*b* of the electro-optic modulator 55 has been described.

The present disclosure proposes a particular and counter-intuitive operation of the single sideband electro-optic modulator 55 with simultaneous application of two microwave signals, as described in relation with FIG. 6. The operation of the electro-optic modulator 55 is thereafter generalized to the simultaneous application of a plurality of microwave signals, said plurality comprising three, four or more microwave signals of distinct frequencies. A laser beam comprising one or several simultaneous spectral lines may be used in applications of atom, ion or molecule spectroscopy.

In FIG. 6, two microwave signals are simultaneously applied to the microwave electrodes 62*a*, 62*b* of each secondary Mach-Zehnder interferometer. More precisely, a first radiofrequency signal at a first microwave pulse, denoted $\Omega_1$, and a second radiofrequency signal at a second microwave pulse, denoted$)_2$, are applied while respecting the criterion of electrical phase-quadrature between the signals applied to the electrode 62*a* and to the electrode 62*b* of the two secondary Mach-Zehnder interferometers. For example, an electrical signal double-modulated at two microwave pulses $\sin(\Omega_1 t)+\sin(\Omega_2 t)$ is applied to the electrode 62*a* and, respectively, another electrical signal double-modulated at two microwave pulses $\cos(\Omega_1 t)+\cos(\Omega_2 t)$ is applied to the electrode 62*b*. The electrical phase shift applied to the low-frequency electrodes 63*a*, 63*b* is tuned to ±π, so as to eliminate the beam at the optical frequency wo. This configuration allows generating two sidelines 68, 69 on the same side of the initial optical frequency wo with a very strong rejection of the other harmonic lines, the energy being distributed between the two so-generated lines 68, and respectively 69, at the optical frequencies $\omega o+\Omega_1$, and respectively $\omega o+\Omega_2$. At the maximum of efficiency, each sideline 68, 69 covers 33.8/2=16.9% of the power contained in the laser beam 65 at the initial optical frequency ωo incident on the electro-optic modulator 55. By way of non-limitative example, the microwave pulses $\Omega_1$ and $\Omega_2$ are in a range between 1 GHz and 20 GHz.

Hence, the electro-optic modulator 55 is adapted to produce simultaneously two sidelines 68, 69 and to switch these sidelines following a sequence of optical frequency changes intended to a cold-atom interferometer system, as described in relation with the diagram of FIG. 1. A programmable microwave generator, with two amplitude and frequency-tunable output channels, is configured to synchronize the two channels from a single reference clock. Preferably, the microwave generator is configured to control the relative electrical phase of the two microwave-frequency channels on the microwave-frequency electrodes 62*a*, 62*b*, which is necessary for the applications of atomic interferometry.

According to the electrical phase-shift, preferably in quadrature, between the electrical signals applied to the electrodes 62*a*, 62*b* and the voltage applied to the electrode 64 of the primary Mach-Zehnder interferometer so as to apply an optical phase-shift of ±π/2 between the outputs of the two secondary Mach-Zehnder interferometers, the electro-optic modulator 55 simultaneously generates two simultaneous sidelines at $\omega o+\Omega_1$, and respectively $\omega o+\Omega_2$, or two sidelines at $\omega o-\Omega_1$, and respectively $\omega o-\Omega_2$.

Moreover, the electro-optic modulator 55 may receive different optical wavelengths. It may be configured by construction to work in a wavelength range located about 850 nm or 780 nm. In this case, the electro-optic modulator 55 can directly drive an experiment chamber 8 containing caesium atoms and whose main transition laser line is equal to 852 nm. The application of so-called SSB modulation, as described in relation with FIGS. 6 and 7, at 9.2 GHz corresponding to the transition between the hyperfine levels of the caesium, allows making an optical-frequency modulable laser source for a caesium-atom interferometer. Such a configuration, conditioned to a stable and fine (i.e. with a line width lower than 1 MHz) initial 852 nm laser source, allows freeing from components such as a frequency doubler of the PPLN type.

Nevertheless, for an application to rubidium atoms, the wavelength of the main transition is shorter (780.24 nm) and it is preferable to use a 1560 nm laser source whose optical frequency is doubled by means of frequency-doubler non-linear optical component of the PPLN type.

The result of the frequency doubling illustrated in FIG. 7 may however be strongly disturbed by this operation. A monochromatic laser source generates a laser beam having a line 65 located, for example, at the wavelength 1560 nm. The laser beam lights the electro-optic modulator 55. One of the two secondary Mach-Zehnder interferometers is modulated by two modulated electrical signals, each according to a cosine function of time, with two microwave pulses $\Omega_1$ and $\Omega_2$, respectively: $\cos(\Omega_1 \cdot t)+\cos(\Omega_2 \cdot t)$. The other secondary Mach-Zehnder interferometer is similarly modulated by the two same microwave signals, but in quadrature with respect to the first secondary Mach-Zehnder interferometer, i.e. with a sine function of time: $\sin(\Omega_1 \cdot t)+\sin(\Omega_2 \cdot t)$.

Generally, the amplitudes of the two microwave pulses $\Omega_1$ and $\Omega_2$ are different from each other by a ratio K. A DC voltage applied to the electrodes 63*a*, 63*b* to tune the static phase of the two secondary Mach-Zehnder interferometers over $-\pi$ radians, that of the primary Mach-Zehnder interferometer being tuned to $\pi/2$. At the output of the electro-optic modulator 55, two sidelines 68 and 69 are obtained that are shifted with respect to the initial laser line, which is itself totally attenuated, as described in relation with FIG. 6. The two sidelines 68, and respectively 69, located at $\omega o+\Omega_1$, and respectively $\omega o+\Omega_2$, have an amplitude that is different by a ratio K in light field amplitude, and by a ratio $K^2$ in optical power of each of the lines. The switching of the optical phase of the primary Mach-Zehnder interferometer from $+\pi/2$ to $-\pi/2$ produces a switching of the optical frequencies of the two sidelines 68, and respectively 69, located at $\omega o-\Omega_1$, and respectively $\omega o-\Omega_2$.

A non-linear optical component 48 is arranged in cascade behind the electro-optic modulator 55. The non-linear optical component 48 has for effect to double, by non-linear optical effect and second harmonic generation, all the optical frequencies that pass through it, by producing a light field corresponding to the square of all the components of the light field that passes through it.

The optical frequency of the signal being doubled, the optical wavelength is then divided by two. When the frequency doubler 48 receives a laser beam at the wavelength of 1560 nm, the transmitted radiation is converted to the wavelength of 780 nm, which corresponds precisely to the transition wavelength of the rubidium atoms that is searched to be produced.

In FIG. 7, two continuous beams of optical frequencies $\omega o+\Omega_1$ and $\omega o+\Omega_2$ and relative field amplitudes equal to 1 and K, respectively, pass through the frequency-doubler non-linear optical component 48. The harmonic 70 at the optical frequency $\omega o-3\Omega_1$ and, respectively, the harmonic 71 at the optical frequency $\omega o-3\Omega_2$ have a very low amplitude. By squaring the sum of the two optical frequency signals $\omega o+\Omega_1$ and $\omega o+\Omega_2$, three components are hence obtained at the PPLN output (see insert on the right of FIG. 7): a first spectral component 72 centred to the doubled optical frequency at $2\omega o+2\Omega_1$ of amplitude 1, a second spectral component 73 corresponding to the cross-term of the two fields is located at the optical frequency $2\omega o+\Omega_1+\Omega_2$ of amplitude 4K and, finally, a third spectral component 74, which is centred to the doubled optical frequency $2\omega o+2\Omega_2$ of relative amplitude $K^2$. FIG. 7 schematically shows the optical frequency difference between the two main lines 68 and 69, which is of $\Omega_2-\Omega_1$ before the frequency doubling and which is maintained between the spectral components 72 and 73 after the frequency doubling. The third spectral component 74 at $2\omega o+2\Omega_2$ is strongly attenuated and can become negligible with respect to the two main spectral components.

Hence considering the light powers produced, the power of the two main lines 72, 73 is equal when the following condition is satisfied: 4K=1, i.e., in field amplitude, a ratio K=0.25 between the sidelines 68, 69 at the output of the electro-optic modulator 55. In this case, the third spectral component 74 at $2\omega o+2\Omega_2$ of power $K^2$ does not represent more than about 6% of the power of the two main lines 72, 73. The amplitude and the power of the main lines produced at the output of the frequency doubler 48 can hence be controlled by adapting the parameter K of relative modulation amplitude between the two modulated electrical signals. The dynamics can be maximized by adjusting the modulation indexes of each of the microwave pulses in such a manner that the sum of the powers of the two sidelines 68, 69 at the output the SSB modulator 55 is equal to 33.8% of the power of the incident laser beam, at the initial optical frequency ωo. This value constitutes a limit and any increase of the electrical power applied to the modulator results in a decrease of amplitude of these sidelines in favour of other sidelines of higher order, which may be harmful to the good operation of the system.

FIG. 8 schematically shows a cold-atom interferometric system comprising a laser source system based on the use of an electro-optic modulator 55 in combination with a microwave synthesizer and, as an option, of a frequency-doubler non-linear optical component.

This laser source system has for advantage to have a strong rate of rejection of all the spurious lines by comparison with what is produced with the laser sources of the prior art. The laser source system for atomic interferometer of the present disclosure is simpler and more compact than the systems of the prior art. The electro-optic modulator 55 indeed allows controlling the generation of sidelines in a reconfigurable manner according to a sequence given by way of example in FIG. 2 or in FIG. 11.

The laser source system illustrated in FIG. 8 comprises a semiconductor or fibre laser source 19 and an electro-optic modulator 55. It is important to note that it is not necessary for this laser source 19 to be wavelength-tunable. Indeed, the electro-optic modulator 55 provides the laser source system with agility and tunability. Moreover, the electro-optic modulator 55 allows compensating for a wavelength difference of the laser source 19 with respect to the atomic transition considered, inside the modulation bandwidth of the electro-optic modulator 55, which is of the order of several tenth of GHz or from 0.05 to 0.1 nm in wavelength.

In a particular embodiment, the laser source 19 is not tunable. According to a particular and advantageous aspect, a feedback electronic output signal 44 is directed to a frequency synthesizer 75. This feedback loop (19, 35, 36, 38, 39, 40, 41, 42, 43, 44) can even be fully eliminated is the optical frequency ωo of the laser source is stable. In this latter case, a pre-calibration of the microwave pulses generated by the frequency synthesizer 75 is sufficient.

The electro-optic modulator 55 is placed in cascade, at the output of the laser source 19 and of the optical isolator 20. The electro-optic modulator 55 is driven by a frequency synthesizer 75, itself electronically controlled. The frequency synthesizer 75 is configured to generate an electrical signal modulated at a microwave pulse or a plurality of electrical signals modulated at several microwave pulses synchronized to a same clock reference. These microwave-pulse modulated electrical signals are rapidly tunable and switchable, including on an amplitude-basis, for example following the sequence of the diagram of FIG. 11.

The microwave-pulse modulated electrical signal consisted of one or several sinusoidal modulations is connected to a large spectral band hybrid coupler 76. The hybrid coupler 76 comprises two electrical output ports 77, 78, which are, by construction, always in quadrature (or at 90 degrees) with respect to each other. One of the output ports 77 of the hybrid coupler 76 hence provides a microwave-pulse modulated electrical signal with a sine time dependence of each modulated electrical signal, whereas the other port 78 is phase-shifted by 90 degrees with respect to the first port 77 with a cosine time dependence of each modulated electrical signal. The two microwave-pulse modulated electrical signals hence supply in quadrature each electrode 62*a*, respectively 62*b*, of the electro-optic modulator 55.

The electro-optic modulator 55 is moreover driven by a control and servo-control electronic circuit 79, also called bias controller. This bias controller allows controlling, by means of a feedback loop, the different static-phase states of the electro-optic modulator 55, i.e. $-\pi$ radian for the electrodes 63*a*, 63*b* of both secondary Mach-Zehnder interferometers, and respectively $\pi/2$ radian for the primary Mach-Zehnder interferometer. At the output of the electro-optic modulator 55 is placed an optical amplifier 47, an optical frequency doubler 48, for example of the PPLN type, and finally an optical amplitude modulator 49, for example an acousto-optic modulator that fulfils a function of light flow optical switch. As an alternative, the optical amplitude modulator 49 may also be placed before the PPLN optical frequency doubler 48. A one input and N outputs (or 1×N) controllable optical switch 80 is placed in cascade at the output of the system and upstream from the experiment chamber 8. The optical switch 80 is preferably a MEMS-based switch. The optical switch 80 allows directing the optical beam coming from an input optical fibre 81 towards, for example, one of the N output optical fibres 82, 83, 84, 85. In the example shown, by way of example, four outputs are considered. These optical fibres allow lighting the experiment chamber 8 according to an optical frequency switch sequence, as described for example in relation with FIG. 1 or FIG. 11. Hence, the beam at the output 83 is used for cooling the atoms, the beam at the output 84 can be implemented for making the interferometer and its three successive pulses $\pi/2$, $\pi$ and $\pi/2$, the beam at the output 85 can be used for performing a fluorescence interrogation on the cloud of atoms in situation of interferences and for performing a fluorescence measurement using the photodiode 18 in order to know the phase of the interferences produced.

According to a particular aspect, a servo-control of the laser source system is performed intermittently and no longer continuously. For that purpose, the beam at the output 82 is used to control the wavelength of the laser 19 by a feedback loop. The servo-control consists in sounding punctually a reference atomic transition of the atoms to very accurately recalibrate the optical frequency of the laser source with respect to this reference atomic transition.

The laser source system of the present disclosure allows performing a measurement of the optical frequency drift of the laser source 19, in an intermittent manner, for example periodically, contrary to the prior art where the optical frequency of the source is continuously servo-controlled as a function of time.

The source system of the present disclosure does not require a specific branch for the permanent control of the laser wavelength contrary to the system of FIG. 3.

The source system of the present disclosure does not require a complex tunable optical filter, contrary to the system of FIG. 4, for example.

Hence, it is proposed to perform an intermittent control, with a single sideband (or optical frequency) to sound a reference hyperfine energy transition for rubidium and to recalibrate the laser source frequency. This intermittent control may be applied in a split cell intended for this control or in the same vacuum chamber containing the atoms of the atomic interferometry experiment.

Hence, in FIG. 8, the beam 82 allows intermittently servo-controlling the optical frequency of the laser source 19 to the atom gas transition, directly in the experiment chamber 8, by means of the optical splitter 35, the quarter-wave plate 36, the mirror 38, the detector 39, an optical amplifier 40, a filter 41, a combiner 42 for mixing the low-frequency signal detected with the source signal coming from the generator 43. The error signal that results from this processing may be processed by an electronic system 44 to be applied as an intermittent, in other words discrete, correction to the slow drifts of the laser 19. In such a configuration, a single semiconductor laser 19 can be used instead of two laser sources in master-slave configuration, which simplifies the general configuration.

This system hence allows a dynamic locking of the laser source: a single laser line is applied to sound the transition of $^{85}$Rb F=3=>F'=3×4 so as to servo-control the laser source with respect to this narrow absorption band and whose value is known in an absolute and very accurate way. This step allows an intermittent lock, on demand.

FIG. 9 shows a variant of FIG. 8, in which the laser source 19 is a semiconductor laser source whose emission wavelength is close to the transition wavelength of the atoms implemented in the experiment. This is the case of a semiconductor optical source having an emission wavelength close to 852 nm, which corresponds to the transition of the caesium atoms. The SSB electro-optic modulator 55 is herein specifically adapted by construction to operate at this other wavelength 852 nm. In this case, the system comprises no non-linear optical component 48 of the frequency-doubler PPLN type or second harmonic generator. There exists no fibre-optic optical amplifier at this wavelength. Nevertheless, the fibre-optic amplifier 47 of the system illustrated in FIG. 8 is replaced by a semiconductor optical amplifier (SOA) 87 operating in the wavelength window about 850 nm. The intermittent servo-control allows compensating for the slow drifts of the optical frequency of the semiconductor laser source between two atomic interferometry experiments.

FIG. 10 shows another variant of FIG. 8, in which the laser source 19 is not tunable. For example, the laser source 19 is a fibre-optic laser source, whose optical frequency is extremely stable. The optical frequency agility of the SSB electro-optical modulator 55 is hence fully used. Unlike the system illustrated in FIG. 8, the output signal of the feedback electronic 44 is directed towards the frequency synthesizer 75 to tune the first pulse $\Omega_1$ and/or the second pulse $\Omega_2$.

In another variant, the feedback loop of the laser source 19 may be eliminated if the optical frequency of the laser source is stable enough to remain in the operating range of the SSB electro-optic modulator 55.

Method

A sequence of interactions between a laser system as described hereinabove and a cloud of atoms, and more particularly in an application of cold-atom and laser-pulse interferometry will now be described.

FIG. 11 illustrates by way of example, the state of the switchable laser source lines that can be applied, during the different steps of a sequence, on the alkali atom gas, for example rubidium, the atoms of which are desired to be slowed down in order to perform matter-wave interference operations. The main steps 1 to 6 are described by way of illustration, in order to give the concerned orders of magnitude, in particular as regards the values of the optical frequencies of the different lines with respect to the reference initial optical frequency. The initial optical frequency ωo is located at a frequency lower than all the lines 101, 201, 301, 401, 501, 601 so as to generate the lines 101, 201, 301, 401, 501, 601 by variable shift of $+\Omega_1$ and, respectively, the lines 102, 202, 302, 502 by variable shift of $+\Omega_2$ with respect to the initial frequency ωo. As an alternative, the initial optical frequency ωo is located at a frequency higher than all the lines 102, 202, 302, 401, 502, 601 so as to generate the lines 101, 201, 301, 401, 501, 601 by variable shift of $-\Omega_1$ and, respectively, the lines 102, 202, 302, 502 by variable shift of $-\Omega_2$ with respect to the initial frequency ωo. Moreover, the initial frequency ωo is selected so that the maximum values of $\Omega_1$ and $\Omega_2$ remain lower than 100 GHz. The two optical frequencies being shifted in the same direction with respect to the initial optical frequency ωo, the latter cannot be located at a frequency comprised between 2 simultaneous lines, as for example between the lines 101 and 102, between the lines 201 and 202, between the lines 301 and 302 nor between the lines 501 and 502.

The first step 1 corresponds to the magneto-optic trap: generally, two laser lines are simultaneously applied in each beam 9. A first laser line 101 is positioned at an optical frequency located 18 MHz under the reference transition of $^{87}$Rb F=2=>F'=3 represented by a vertical dotted line whereas the other laser line 102 is positioned with a spacing of 6.567 GHz above this reference transition.

The second step 2, called the molasse step, requires a first laser line 201 this time shifted by 100 MHz under the reference transition, whereas the other line 202 keeps the position of the line 102, at 6.567 GHz above the reference transition.

In an application of the cold-atom and laser-pulse interferometry, steps 3 and 4 are then applied. These steps are however not indispensable in other applications, as for example the atom, ion or molecule spectroscopy.

The third step 3 is that of the interferometer and corresponds to the so-called two-photon Raman pumping step that takes place in three times called (π/2, π, π/2). The first line 301 is shifted by 1 GHz under the reference frequency, and this time, the spacing between the two lines 301 and 302, required for the Raman pumping, corresponds to the absolute transition of the hyperfine level F=1=>F=2 of 6.834 GHz. Moreover, it is necessary to control the phase between the two optical frequencies of the lines 301 and 302 in this step 3 by controlling the phase between the signals $\cos(\Omega_1 t)$ and $\cos(\Omega_2 t)$ and, respectively, between the signals $\sin(\Omega_1 t)$ and $\sin(\Omega_2 t)$, by means of the electronic system 75 and 76.

The fourth step 4 is the first part of the fluorescence detection of the interference: a single line 401 is positioned exactly on the transition of $^{87}$Rb F=2=>F'=3, in order to count the number of atoms in the first state.

Step 5 corresponds to the second part of the interference detection: two lines 501, respectively 502, are positioned in such a way to count the total number of atoms in the two states g and e. In atomic interferometry, it is deduced from steps 4 and 5 two successive fluorescence measurements of the state of the interference figure. However, in certain experiments, step 5 can be performed without step 4.

The present disclosure proposes an additional step 6, which is a servo-control step applied intermittently, with a single optical frequency to sound a reference atomic transition of Rubidium and to recalibrate the frequency ωo of the laser source. For that purpose, the laser beam is sequentially withdrawn (for example, via a switch) to sound another reference atomic transition, only at a precise moment (step 6) and not continuously during steps 1 to 5. A discrete time locking is hence obtained, which advantageously replaces the continuous locking of the prior art.

FIG. 11 illustrates the great agility of the radiation emitted by the laser source and applied to the experiment chamber that allows switching in very short times from one line to the other one with jumps from several tens to several hundreds of MHz according to the steps of the sequence. At steps 1, 2, 3 and 5, two simultaneous lines at the optical frequency $\omega o+\Omega_1$, and respectively $\omega o+\Omega_2$, are present, whereas steps 4 and 6 impose a single line at another shifted optical frequency ωo+Ω. From a source laser having a single line tuned with respect to an absolute reference, the laser source provides a great flexibility and a great agility of reconfiguration, allowing the shift between the one or two optical frequencies and the absolute reference to be split and extremely accurately tuned, without generating spurious lines.

More generally, steps 1, 2 and 5 may be used in other applications of interaction between laser and chemical species, without implementing steps 3 and 4 of interferometry, for example for spectroscopy measurements on atoms, ions or molecules.

The invention claimed is:

1. A device for interaction between a laser beam and a hyperfine energy transition of a chemical species placed in a vacuum space, comprising:

a laser source (19) adapted to emit a source laser beam at an initial optical frequency (ωo), wherein the device further includes:

a single sideband electro-optic modulator (55) comprising an input optical waveguide (57) adapted to receive the source laser beam and an output optical waveguide adapted to generate an output laser beam, the electro-optic modulator (55) having a first high-frequency electrode (62*a*), another high-frequency electrode (62*b*) and a plurality of low-frequency electrodes (63*a*, 63*b*, 64), a low-frequency voltage generator (79), configured to apply on each of said low-frequency electrodes a low-frequency voltage adapted to generate a predetermined optical phase-shift in the optical waveguide, and an electronic system (75, 76) comprising a clock, the electronic system (75, 76) being adapted to generate a first electrical signal ($\sin(\Omega t)$, $\sin(\Omega_1 t)$) modulated at a first pulse (Ω, $\Omega_1$) and, respectively, another electrical signal ($\cos(\Omega t)$, $\cos(\Omega_1 t)$) modulated at the first pulse (Ω, $\Omega_1$), synchronized by the clock, the electronic system (75, 76) being adapted to amplitude and phase-tune the first modulated electrical signal ($\sin(\Omega t)$, $\sin(\Omega_1 t)$) with respect to the other electrical signal ($\cos(\Omega t)$, $\cos(\Omega_1 t)$) modulated at the first pulse (Ω, $\Omega_1$), the electronic system (75, 76) being adapted to simultaneously apply the first electrical signal ($\sin(\Omega t)$, $\sin(\Omega_1 t)$) modulated at the first pulse ($\Omega$, $\Omega_1$) to the first high-frequency electrode (62*a*) and, respectively, the other electrical signal ($\cos(\Omega t)$, $\cos(\Omega_1 t)$) modulated at the first pulse ($\Omega$, $\Omega_1$) to the other high-frequency electrode (62*b*), and the electronic system (75, 76) being adapted to switch and tune the first pulse ($\Omega$, $\Omega_1$) in a microwave spectral range extending over at most 100 gigahertz so as to frequency-switch the output laser beam to a first optical frequency ($\omega o+\Omega$, $\omega o+\Omega_1$, $\omega o-\Omega$, $\omega o-\Omega_1$) shifted by the first pulse ($\Omega$, $\Omega_1$) with respect to the initial optical frequency ($\omega o$) while attenuating the output laser beam at the initial optical frequency ($\omega o$) and at the other harmonics of the first pulse ($\Omega$, $\Omega_1$) with respect to the initial optical frequency ($\omega o$), wherein the electronic system (75, 76) is adapted to generate a second electrical signal ($\sin(\Omega_2 t)$) modulated at a second pulse ($\Omega_2$) and, respectively, another electrical signal ($\cos(\Omega 2t)$) modulated at the second pulse ($\Omega_2$), the second modulated electrical signal ($\sin(\Omega_2 t)$) and the other electrical signal ($\cos(\Omega_2 t)$) modulated at the second pulse ($\Omega_2$) being synchronized by the clock, the electronic system (75, 76) being adapted to amplitude and phase-tune the second electrical signal ($\sin(\Omega_2 t)$) modulated at the second pulse ($\Omega_2$) with respect to the first electrical signal ($\sin(\Omega t)$, $\sin(\Omega_1 t)$) modulated at the first pulse ($\Omega$, $\Omega_1$) and to form a first electrical signal double-modulated at the first pulse ($\Omega$, $\Omega_1$) and at the second pulse ($\Omega_2$), the electronic system (75, 76) being adapted to amplitude and phase-tune the other electrical signal ($\cos(\Omega_2 t)$) modulated at the second pulse ($\Omega_2$) with respect to the other electrical signal ($\cos(\Omega t)$, $\cos(\Omega_1 t)$) modulated at the first pulse ($\Omega$, $\Omega_1$) and to form another electrical signal double-modulated at the first pulse ($\Omega$, $\Omega_1$) and the second pulse ($\Omega_2$), and the electronic system (75, 76) being adapted to electrical phase-shift-tune the first double-modulated electrical signal with respect to the other double-modulated electrical signal, and the electronic system (75, 76) being adapted to simultaneously apply the first double-modulated electrical signal to the first high-frequency electrode (62*a*) and, respectively, the other double-modulated electrical signal to the other high-frequency electrode (62*b*), and the electronic system (75, 76) being adapted to switch and tune the second pulse ($\Omega_2$) in a microwave spectral range extending over at most 100 gigahertz so as to frequency-switch the output laser beam simultaneously to the first optical frequency shifted by the first pulse ($\Omega$, $\Omega_1$) with respect to the initial optical frequency ($\omega o$) and to a second optical frequency shifted by the second pulse ($\Omega_2$) with respect to the initial optical frequency ($\omega o$), the first shifted optical frequency and the second shifted optical frequency being shifted in the same direction with respect to the initial optical frequency ($\omega o$), while attenuating the output laser beam at the other harmonics of the second pulse ($\Omega_2$) with respect to the initial optical frequency ($\omega o$).

2. A device for interaction between a laser beam and a hyperfine energy transition of a chemical species placed in a vacuum space, comprising:

a laser source (19) adapted to emit a source laser beam at an initial optical frequency ($\omega o$), wherein the device further includes:

a single sideband electro-optic modulator (55) comprising an input optical waveguide (57) adapted to receive the source laser beam and an output optical waveguide adapted to generate an output laser beam, the electro-optic modulator (55) having a first high-frequency electrode (62*a*), another high-frequency electrode (62*b*) and a plurality of low-frequency electrodes (63*a*, 63*b*, 64), a low-frequency voltage generator (79), configured to apply on each of said low-frequency electrodes a low-frequency voltage adapted to generate a predetermined optical phase-shift in the optical waveguide, and an electronic system (75, 76) comprising a clock, the electronic system (75, 76) being adapted to generate a first electrical signal ($\sin(\Omega t)$, $\sin(\Omega_1 t)$) modulated at a first pulse ($\Omega$, $\Omega_1$) and, respectively, another electrical signal ($\cos(\Omega t)$, $\cos(\Omega_1 t)$) modulated at the first pulse ($\Omega$, $\Omega_1$), synchronized by the clock, the electronic system (75, 76) being adapted to amplitude and phase-tune the first modulated electrical signal ($\sin(\Omega t)$, $\sin(\Omega_1 t)$) with respect to the other electrical signal ($\cos(\Omega t)$, $\cos(\Omega_1 t)$) modulated at the first pulse ($\Omega$, $\Omega_1$), the electronic system (75, 76) being adapted to simultaneously apply the first electrical signal ($\sin(\Omega t)$, $\sin(\Omega_1 t)$) modulated at the first pulse ($\Omega$, $\Omega_1$) to the first high-frequency electrode (62*a*) and, respectively, the other electrical signal ($\cos(\Omega t)$, $\cos(\Omega_1 t)$) modulated at the first pulse ($\Omega$, $\Omega_1$) to the other high-frequency electrode (62*b*), and the electronic system (75, 76) being adapted to switch and tune the first pulse ($\Omega$, $\Omega_1$) in a microwave spectral range extending over at most 100 gigahertz so as to frequency-switch the output laser beam to a first optical frequency ($\omega o+\Omega$, $\omega o+\Omega_1$, $\omega o-\Omega$, $\omega o-\Omega_1$) shifted by the first pulse ($\Omega$, $\Omega_1$) with respect to the initial optical frequency ($\omega o$) while attenuating the output laser beam at the initial optical frequency ($\omega o$) and at the other harmonics of the first pulse ($\Omega$, $\Omega_1$) with respect to the initial optical frequency ($\omega o$), wherein the electronic system (75, 76) includes a radiofrequency electronic synthesizer (75) adapted to generate an electrical signal modulated at the first pulse ($\Omega$, $\Omega_1$) and a hybrid coupler (76) having a first output channel (77) and a second output channel (78), the first output channel (77) being electrically connected to the first high-frequency electrode (62*a*), and respectively, the second output channel (78) being electrically connected to the other high-frequency electrode (62*b*), the hybrid coupler (76) being adapted to receive the electrical signal modulated at the first pulse ($\Omega$, $\Omega_1$) and to generate the first electrical signal ($\sin(\Omega t)$, $\sin(\Omega_1 t)$) modulated at the first pulse ($\Omega$, $\Omega_1$) on the first output channel (77) and, respectively, the other electrical signal ($\cos(\Omega t)$, $\cos(\Omega_1 t)$) modulated at the first pulse ($\Omega$, $\Omega_1$), in phase-quadrature, on the second output channel (78).

3. The device according to claim 1, wherein the electronic system (75, 76) includes a radiofrequency electronic synthesizer (75) adapted to generate an electrical signal modulated at the first pulse ($\Omega$, $\Omega_1$) and a hybrid coupler (76) having a first output channel (77) and a second output channel (78), the first output channel (77) being electrically connected to the first high-frequency electrode (62*a*), and respectively, the second output channel (78) being electrically connected to the other high-frequency electrode (62*b*), the hybrid coupler (76) being adapted to receive the electrical signal modulated at the first pulse ($\Omega$, $\Omega_1$) and to generate the first electrical signal ($\sin(\Omega t)$, $\sin(\Omega_1 t)$) modulated at the first pulse ($\Omega$, $\Omega_1$) on the first output channel (77) and, respectively, the other electrical signal ($\cos(\Omega t)$, cos ($\Omega_1 t$)) modulated at the first pulse ($\Omega$, $\Omega_1$), in phase-quadrature, on the second output channel (78), and wherein the radiofrequency electronic synthesizer (75) is adapted to generate an electrical signal modulated at the second pulse ($\Omega_2$), the hybrid coupler (76) being adapted to receive the electrical signal modulated at the second pulse ($\Omega_2$) and to generate the second electrical signal modulated ($\sin(\Omega_2 t)$) at the second pulse ($\Omega_2$) on the first output channel (77) and, respectively, the other electrical signal ($\cos(\Omega_2 t)$) modulated at the second pulse ($\Omega_2$), in phase-quadrature, on the second output channel (78).

4. The device according to claim 1, further comprising a non-linear optical component (48) arranged to receive the output laser beam at the first optical frequency shifted by the first pulse ($\Omega_1$) with respect to the initial optical frequency (ωo) and/or at the second optical frequency shifted by the second pulse ($\Omega_2$) with respect to the initial optical frequency (ωo), the non-linear optical component (48) being adapted to generate a laser beam at an optical frequency equal to twice the first shifted optical frequency, at an optical frequency equal to twice the second shifted optical frequency and/or, respectively, at an optical frequency equal to the sum of the first shifted optical frequency and of the second shifted optical frequency.

5. The device according to claim 1, further comprising an optical switch (80), the optical switch (80) having an input path (81) and a plurality of output paths (82, 83, 84, 85), the optical switch (80) being adapted to receive on the input path and to direct to one of the output paths the output laser beam at the first optical frequency shifted by the first pulse ($\Omega_1$) with respect to the initial optical frequency (ωo), the output laser beam at the second optical frequency shifted by the second pulse ($\Omega_2$) with respect to the initial optical frequency (ωo), the laser beam at the optical frequency equal to twice the first shifted optical frequency, the laser beam at the optical frequency equal to twice the second shifted optical frequency and/or, respectively, the laser beam at the optical frequency equal to the sum of the first shifted optical frequency and of the second shifted optical frequency.

6. The device according to claim 1, comprising an electronic feedback loop comprising a photodetector (39), an electrical source (43) and a signal mixer (42), the photodetector (39) being adapted to measure a signal of absorption by the chemical species (7, 11, 15, 16) of the output laser beam at the first shifted optical frequency, at the second shifted optical frequency, of the laser beam at the optical frequency equal to twice the first shifted optical frequency, of the laser beam at the optical frequency equal to twice the second shifted optical frequency and/or, respectively, of the laser beam at the optical frequency equal to the sum of the first shifted optical frequency and of the second shifted optical frequency, the electrical source (43) being adapted to generate a low-frequency signal and the signal mixer (42) being adapted to mix the absorption signal and the low-frequency signal to form an error signal.

7. The device according to claim 6, wherein the electronic feedback loop is configured to intermittently apply the error signal to the laser source (19) so as to tune the initial optical frequency (ωo) to a reference hyperfine energy transition of the chemical species.

8. The device according to claim 7, wherein the electronic feedback loop is configured to intermittently apply the error signal to the electronic system (75, 76) so as to tune the first pulse ($\Omega$, $\Omega_1$) and/or the second pulse ($\Omega_2$).

9. The device according to claim 1, wherein the laser source (19) comprises a semiconductor laser or a fibre-optic laser.

10. A cold-atom and laser-pulse interferometer comprising a device according to claim 3, wherein the chemical species is consisted of atoms and wherein the radiofrequency electronic synthesizer (75) is adapted to switch the first pulse ($\Omega_1$) and the second pulse ($\Omega_2$) according to a predetermined sequence.

11. A hyperfine optical spectrometry apparatus comprising a device according to claim 1, wherein the chemical species is consisted of atoms, ions or molecules, and comprising a detector adapted to measure a hyperfine energy transition of the chemical species by absorption, reflection or scattering of the frequency-shifted laser beam.

12. A method for interaction between a laser beam and a hyperfine energy transition of a chemical species comprising the following steps:

confining the chemical species (7, 11, 15, 16) in a vacuum space (8), emitting a source laser beam at an initial optical frequency (ωo), injecting the source laser beam to an input optical waveguide (57) of a single sideband electro-optic modulator (55), generating a first electrical signal ($\sin(\Omega t)$, $\sin(\Omega_1 t)$) modulated at a first pulse ($\Omega$,$\Omega_1$) synchronized to a clock and, respectively, another electrical signal ($\cos(\Omega t)$, $\cos(\Omega t)$) modulated at the first pulse ($\Omega$,$\Omega_1$) synchronized to the clock, the first pulse ($\Omega$,$\Omega_1$) being switchable and tunable in a microwave spectral range extending over at most 100 gigahertz, amplitude and phase-tuning the first modulated electrical signal ($\sin(\Omega t)$, $\sin(\Omega_1 t)$) with respect to the other electrical signal ($\cos(\Omega t)$, $\cos(\Omega_1 t)$) modulated at the first pulse ($\Omega$,$\Omega_1$), simultaneously applying the first electrical signal (sin ($\Omega$t), sin (Q modulated at the first pulse ($\Omega$,$\Omega_1$) to a first high-frequency electrode (62*a*) of the electro-optic modulator (55) and, respectively, the other electrical signal ($\cos(\Omega t)$, cos ($Q_1$t)) modulated at the first pulse ($\Omega$,$\Omega_1$) to another high-frequency electrode (62*b*) of the electro-optic modulator (55) so as to selectively generate, on an output optical waveguide (157) of the electro-optic modulator (55), an output laser beam at a first optical frequency shifted by the first pulse ($\Omega$, $\Omega_1$) with respect to the initial optical frequency (ωo) while attenuating the laser beam at the initial optical frequency (ωo) and at the other harmonic frequencies of the first pulse ($\Omega$,$\Omega_1$) with respect to the initial optical frequency (ωo), optically amplifying (47, 87) the output laser beam to generate a laser beam amplified at the first shifted optical frequency (ωo+$\Omega$, ωo+$\Omega_1$, ωo−$\Omega$, ωo−$\Omega_1$), transmitting the first laser beam amplified at the first optical frequency shifted (ωo+$\Omega$, ωo+$\Omega_1$) towards the chemical species (7, 11, 15, 16), for it to interact with a hyperfine energy transition of the chemical species (7, 11, 15, 16), generating a second electrical signal ($\sin(\Omega_2 t)$) modulated at a second pulse ($\Omega_2$) synchronized to the clock and, respectively, another electrical signal ($\cos(\Omega_2 t)$) modulated at the second pulse ($\Omega_2$), synchronized to the clock, the second pulse ($\Omega_2$) being switchable and tunable in a microwave spectral range extending over at most 100 gigahertz, amplitude and phase-tuning the second electrical signal ($\sin(\Omega_2 t)$) modulated at the second pulse ($\Omega_2$) with respect to the first electrical signal ($\sin(\Omega t)$, $\sin(\Omega_1 t)$) modulated at the first pulse ($\Omega$, $\Omega_1$) to form a first electrical signal double-modulated at the first pulse ($\Omega$, $\Omega_1$) and the second pulse ($\Omega_2$), and amplitude and phase-tuning the other electrical signal modulated ($\cos(\Omega_2 t)$) at the second pulse ($\Omega_2$) with respect to the other electrical signal ($\cos(\Omega t)$, $\cos(\Omega_1 t)$) modulated at the first pulse ($\Omega$, $\Omega_1$) to form another electrical signal double-modulated at the first pulse ($\Omega$, $\Omega_1$) and the second pulse ($\Omega_2$), electrical phase-tuning the first double-modulated electrical signal with respect to the other double-modulated electrical signal, simultaneously applying the first double-modulated electrical signal to the first high-frequency electrical signal (62*a*) of the electro-optic modulator (55) and, respectively, the other double-modulated electrical signal to the other high-frequency electrode (62*b*) of the electro-optic modulator (55) so as to generate on the output optical waveguide (157) of the electro-optic modulator (55), an output laser beam simultaneously switched to the first optical frequency shifted by the first pulse ($\Omega$, $\Omega_1$) with respect to the initial optical frequency ($\omega o$) and to a second optical frequency shifted by the second pulse ($\Omega_2$) with respect to the initial optical frequency ($\omega o$), the first shifted optical frequency and the second shifted optical frequency being shifted in the same direction with respect to the initial optical frequency ($\omega o$), optically amplifying (47, 87) the output laser beam to generate a laser beam simultaneously amplified at the first shifted optical frequency ($\omega o+\Omega$, $\omega o+Q_1$, $\omega o-\Omega$, $\omega o-\Omega_1$) and at the second shifted optical frequency, and transmitting the laser beam simultaneously amplified at the first shifted optical frequency ($\omega o+\Omega$, $\omega o+Q_1$, $\omega o-\Omega$, $\omega o-\Omega_1$) and at the second shifted optical frequency towards the chemical species (7, 11, 15, 16).

13. The device according to claim 1, further comprising a non-linear optical component (48) arranged to receive the output laser beam at the first optical frequency shifted by the first pulse ($\Omega_1$) with respect to the initial optical frequency ($\omega o$) and/or at the second optical frequency shifted by the second pulse ($\Omega_2$) with respect to the initial optical frequency ($\omega o$), the non-linear optical component (48) being adapted to generate a laser beam at an optical frequency equal to twice the first shifted optical frequency, at an optical frequency equal to twice the second shifted optical frequency and/or, respectively, at an optical frequency equal to the sum of the first shifted optical frequency and of the second shifted optical frequency.

14. The device according to claim 2, further comprising a non-linear optical component (48) arranged to receive the output laser beam at the first optical frequency shifted by the first pulse ($\Omega_1$) with respect to the initial optical frequency ($\omega o$) and/or at the second optical frequency shifted by the second pulse ($\Omega_2$) with respect to the initial optical frequency ($\omega o$), the non-linear optical component (48) being adapted to generate a laser beam at an optical frequency equal to twice the first shifted optical frequency, at an optical frequency equal to twice the second shifted optical frequency and/or, respectively, at an optical frequency equal to the sum of the first shifted optical frequency and of the second shifted optical frequency.

15. The device according to claim 3, further comprising a non-linear optical component (48) arranged to receive the output laser beam at the first optical frequency shifted by the first pulse ($\Omega$) with respect to the initial optical frequency ($\omega o$) and/or at the second optical frequency shifted by the second pulse ($\Omega_2$) with respect to the initial optical frequency ($\omega o$), the non-linear optical component (48) being adapted to generate a laser beam at an optical frequency equal to twice the first shifted optical frequency, at an optical frequency equal to twice the second shifted optical frequency and/or, respectively, at an optical frequency equal to the sum of the first shifted optical frequency and of the second shifted optical frequency.

16. The device according to claim 1, further comprising an optical switch (80), the optical switch (80) having an input path (81) and a plurality of output paths (82, 83, 84, 85), the optical switch (80) being adapted to receive on the input path and to direct to one of the output paths the output laser beam at the first optical frequency shifted by the first pulse ($\Omega_1$) with respect to the initial optical frequency ($\omega o$), the output laser beam at the second optical frequency shifted by the second pulse ($\Omega_2$) with respect to the initial optical frequency ($\omega o$), the laser beam at the optical frequency equal to twice the first shifted optical frequency, the laser beam at the optical frequency equal to twice the second shifted optical frequency and/or, respectively, the laser beam at the optical frequency equal to the sum of the first shifted optical frequency and of the second shifted optical frequency.

17. The device according to claim 2, further comprising an optical switch (80), the optical switch (80) having an input path (81) and a plurality of output paths (82, 83, 84, 85), the optical switch (80) being adapted to receive on the input path and to direct to one of the output paths the output laser beam at the first optical frequency shifted by the first pulse ($\Omega_1$) with respect to the initial optical frequency ($\omega o$), the output laser beam at the second optical frequency shifted by the second pulse ($\Omega_2$) with respect to the initial optical frequency ($\omega o$), the laser beam at the optical frequency equal to twice the first shifted optical frequency, the laser beam at the optical frequency equal to twice the second shifted optical frequency and/or, respectively, the laser beam at the optical frequency equal to the sum of the first shifted optical frequency and of the second shifted optical frequency.

18. The device according to claim 3, further comprising an optical switch (80), the optical switch (80) having an input path (81) and a plurality of output paths (82, 83, 84, 85), the optical switch (80) being adapted to receive on the input path and to direct to one of the output paths the output laser beam at the first optical frequency shifted by the first pulse ($\Omega_1$) with respect to the initial optical frequency ($\omega o$), the output laser beam at the second optical frequency shifted by the second pulse ($\Omega_2$) with respect to the initial optical frequency ($\omega o$), the laser beam at the optical frequency equal to twice the first shifted optical frequency, the laser beam at the optical frequency equal to twice the second shifted optical frequency and/or, respectively, the laser beam at the optical frequency equal to the sum of the first shifted optical frequency and of the second shifted optical frequency.

* * * * *